(12) United States Patent
Gao et al.

(10) Patent No.: US 11,626,556 B2
(45) Date of Patent: Apr. 11, 2023

(54) HARD MASK AND PREPARATION METHOD THEREOF, PREPARATION METHOD OF JOSEPHSON JUNCTION, AND SUPERCONDUCTING CIRCUIT

(71) Applicant: ALIBABA GROUP HOLDING LIMITED, Grand Cayman (KY)

(72) Inventors: Ran Gao, Hangzhou (CN); Jingwei Zhou, Hangzhou (CN); Chunqing Deng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 17/216,179

(22) Filed: Mar. 29, 2021

(65) Prior Publication Data

US 2021/0313507 A1 Oct. 7, 2021

(30) Foreign Application Priority Data

Apr. 1, 2020 (CN) .......................... 202010250679.5

(51) Int. Cl.
| | |
|---|---|
| H01L 39/22 | (2006.01) |
| H01L 39/24 | (2006.01) |
| H01L 21/306 | (2006.01) |
| H01L 27/18 | (2006.01) |
| H01L 39/02 | (2006.01) |

(52) U.S. Cl.
CPC ...... *H01L 39/223* (2013.01); *H01L 21/30608* (2013.01); *H01L 27/18* (2013.01); *H01L 39/025* (2013.01); *H01L 39/2493* (2013.01)

(58) Field of Classification Search
CPC ..... H01L 21/30608; H01L 39/223–226; H01L 39/2493–2496; H01L 21/308–3088; G03F 7/20–24; G03F 7/70–70991; G03F 7/26–428
See application file for complete search history.

(56) References Cited

U.S. PATENT DOCUMENTS

| | | | |
|---|---|---|---|
| 4,145,699 | A | 3/1979 | Hu et al. |
| 7,138,341 | B1 | 11/2006 | Sharma |

(Continued)

FOREIGN PATENT DOCUMENTS

| | | |
|---|---|---|
| CN | 101231948 A | 7/2008 |
| CN | 104701451 A | 6/2015 |

(Continued)

OTHER PUBLICATIONS

First Office Action issued in corresponding Chinese Application No. 202010250679.5 dated Nov. 16, 2021 (7 pages).

(Continued)

*Primary Examiner* — Shahed Ahmed
(74) *Attorney, Agent, or Firm* — Finnegan, Henderson, Farabow, Garrett & Dunner, LLP

(57) ABSTRACT

A hard mask includes a silicon oxide layer provided on a bare silicon wafer; and a silicon nitride layer provided on the silicon oxide layer, wherein the silicon nitride is provided with a first pattern, the silicon oxide layer is provided with a second pattern corresponding to the first pattern, the first pattern and the second pattern have different shapes, and the first pattern and the second pattern are configured to assist in forming a Josephson junction on the bare silicon wafer.

9 Claims, 11 Drawing Sheets

(56) References Cited

U.S. PATENT DOCUMENTS

| | | | |
|---|---|---|---|
| 10,243,132 B1 | 3/2019 | Rosenblatt et al. | |
| 2016/0093790 A1* | 3/2016 | Rigetti | H01L 39/025 257/31 |
| 2019/0288176 A1 | 9/2019 | Yoscovits et al. | |
| 2020/0343434 A1* | 10/2020 | Rubin | H01L 39/2493 |

FOREIGN PATENT DOCUMENTS

| | | |
|---|---|---|
| CN | 104979269 A | 10/2015 |
| CN | 108110131 A | 6/2018 |
| CN | 110034228 A | 7/2019 |
| CN | 110291649 A | 9/2019 |
| JP | 2002076456 A | 3/2002 |
| WO | WO 2017/205658 A1 | 11/2017 |

OTHER PUBLICATIONS

Supplemental Search Report issued in corresponding Chinese Application No. 202010250679.5 dated Jan. 24, 2022 (1 page).

Search Report issued in corresponding Chinese Application No. 202010250679.5 dated Nov. 6, 2021 (3 pages).

Lu, Dong, et al., "Solid State Physics," 137 Josephson, Dec. 31, 2010, pp. 1-44.

* cited by examiner

500

501 Acquire stress information of silicon nitride layer

502 When stress information is greater than preset stress threshold, adjust ratio between nitrogen material and silicon material in silicon nitride layer so that stress information is less than or equal to preset stress threshold

601 Form image transmission layer on upper end of silicon nitride layer

602 Form third pattern on image transmission layer

603 Form first pattern on silicon nitride layer based on third pattern

| When second hard mask is located on upper end of first hard mask, form plurality of preset patterns on second hard mask | ⟵ 1101 |

↓

| Remove first hard mask and second hard mask located on bare silicon wafer based on plurality of preset patterns | ⟵ 1102 |

FIG. 11

HARD MASK AND PREPARATION METHOD THEREOF, PREPARATION METHOD OF JOSEPHSON JUNCTION, AND SUPERCONDUCTING CIRCUIT

CROSS-REFERENCE TO RELATED APPLICATIONS

This application claims priority to Chinese Application 202010250679.5, filed on Apr. 1, 2020, the content of which is incorporated herein by reference in its entirety.

TECHNICAL FIELD

The present disclosure relates to the technical field of superconducting circuits, in particular, to a hard mask and a preparation method thereof, an example method for preparing a Josephson junction, and a superconducting circuit.

BACKGROUND

The preparation of superconducting quantum bit ("qubit") devices involves preparing a Josephson junction. The process for preparing a Josephson junction involves soft mask plate technology based on an electron beam photoresist. The soft mask plate technology can be convenient and stable. However, because of using an organic polymer as a template material, the soft mask plate technology can be disadvantaged due to its needs to maintain low temperature, low bombardment, non-cleaning, and other preset conditions. Therefore, when a Josephson junction is prepared using the soft mask technology, the process conditions for its preparation can have strict requirements.

SUMMARY OF THE DISCLOSURE

Embodiments of the present disclosure provide a hard mask including a silicon oxide layer provided on a bare silicon wafer; and a silicon nitride layer provided on the silicon oxide layer, wherein the silicon nitride is provided with a first pattern, the silicon oxide layer is provided with a second pattern corresponding to the first pattern, the first pattern and the second pattern have different shapes, and the first pattern and the second pattern are configured to assist in forming a Josephson junction on the bare silicon wafer.

Embodiments of the present disclosure also provide a method for preparing a hard mask. The method includes forming a silicon oxide layer on a preset bare silicon wafer; forming a silicon nitride layer on the silicon oxide layer; and forming a first pattern on the silicon nitride layer and a second pattern corresponding to the first pattern on the silicon oxide layer to form a hard mask, wherein the first pattern and the second pattern have different shapes, and the first pattern and the second pattern are configured to assist in forming a Josephson junction on the bare silicon wafer.

Embodiments of the present disclosure further provide a device for preparing a hard mask. The device includes a memory configured to store a set of instructions and one or more processors communicatively coupled to the memory and configured to execute the set of instructions to cause the apparatus to perform a method. The method includes: forming a silicon oxide layer on a preset bare silicon wafer; forming a silicon nitride layer on the silicon oxide layer; and forming a first pattern on the silicon nitride layer and a second pattern corresponding to the first pattern on the silicon oxide layer to form a hard mask, wherein the first pattern and the second pattern have different shapes, and the first pattern and the second pattern are configured to assist in forming a Josephson junction on the bare silicon wafer.

Embodiments of the present disclosure further provide a non-transitory computer-readable medium, which stores a set of instructions that is executable by at least one processor of an apparatus to cause the apparatus to perform a method for preparing a hard mask. The method includes: forming a silicon oxide layer on a preset bare silicon wafer; forming a silicon nitride layer on the silicon oxide layer; and forming a first pattern on the silicon nitride layer and a second pattern corresponding to the first pattern on the silicon oxide layer to form a hard mask, wherein the first pattern and the second pattern have different shapes, and the first pattern and the second pattern are configured to assist in forming a Josephson junction on the bare silicon wafer.

Embodiments of the present disclosure further provide a method for preparing a Josephson junction. The method includes forming a preset material on a preset bare silicon wafer through a first hard mask to generate a first structure; forming the preset material on the preset bare silicon wafer through a second hard mask to generate a second structure, the first structure and the second structure being in different directions; and generating the Josephson junction through the first structure and the second structure, the Josephson junction serving as a nonlinear inductance element.

Embodiments of the present disclosure further provide a device for preparing a Josephson junction. The device includes a memory configured to store a set of instructions and one or more processors communicatively coupled to the memory and configured to execute the set of instructions to cause the apparatus to perform a method. The method includes: forming a preset material on a preset bare silicon wafer through a first hard mask to generate a first structure; forming the preset material on the preset bare silicon wafer through a second hard mask to generate a second structure, the first structure and the second structure being in different directions; and generating the Josephson junction through the first structure and the second structure, the Josephson junction serving as a nonlinear inductance element.

Embodiments of the present disclosure further provide a non-transitory computer-readable medium, which stores a set of instructions that is executable by at least one processor of an apparatus to cause the apparatus to perform a method for preparing a Josephson junction. The method includes: forming a preset material on a preset bare silicon wafer through a first hard mask to generate a first structure; forming the preset material on the preset bare silicon wafer through a second hard mask to generate a second structure, the first structure and the second structure being in different directions; and generating the Josephson junction through the first structure and the second structure, the Josephson junction serving as a nonlinear inductance element.

Embodiments of the present disclosure further provide a superconducting circuit. The superconducting circuit includes a Josephson junction serving as a nonlinear inductance element, the Josephson junction being prepared by a method. The method includes: forming a preset material on a preset bare silicon wafer through a first hard mask to generate a first structure; forming the preset material on the preset bare silicon wafer through a second hard mask to generate a second structure, the first structure and the second structure being in different directions; and generating the Josephson junction through the first structure and the second structure.

Embodiments of the present disclosure further provide a hard mask being prepared by a method. The method includes: forming a silicon oxide layer on a preset bare silicon wafer; forming a silicon nitride layer on the silicon oxide layer; and forming a first pattern on the silicon nitride layer and a second pattern corresponding to the first pattern on the silicon oxide layer to form a hard mask, wherein the first pattern and the second pattern have different shapes, and the first pattern and the second pattern are configured to assist in forming a Josephson junction on the bare silicon wafer.

BRIEF DESCRIPTION OF THE DRAWINGS

The accompanying drawings described here are used to provide a further understanding of the present disclosure and constitute a part of the present disclosure. The example embodiments of the present disclosure and descriptions thereof are used to explain the present disclosure, and do not constitute an improper limitation to the present disclosure.

FIG. 5 is a flowchart illustrating another example method for preparing a hard mask, consistent with some embodiments of this disclosure.

FIG. 6A is a flowchart illustrating an example method for forming a first pattern on a silicon nitride layer, consistent with some embodiments of this disclosure.

FIG. 11 is a flowchart illustrating an example method for removing a first hard mask and a second hard mask located on a bare silicon wafer, consistent with some embodiments of this disclosure.

DETAILED DESCRIPTION

Figure 1:
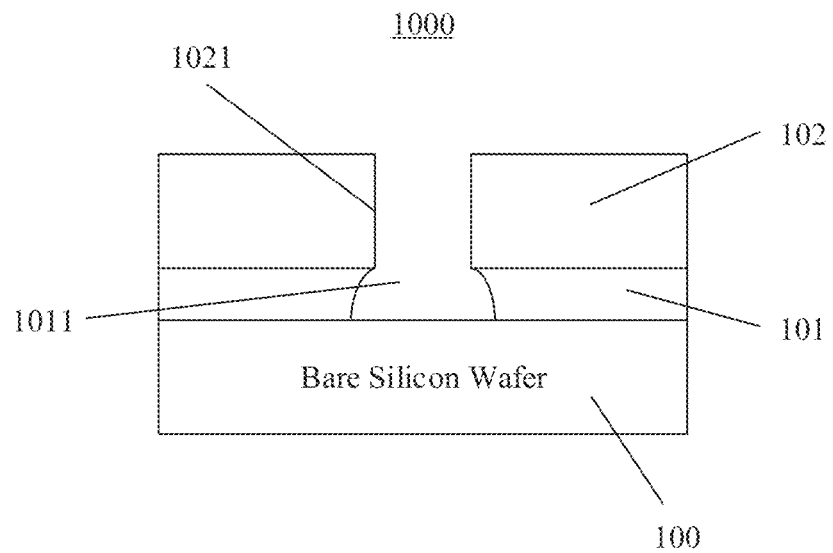
FIG. 1 is a schematic diagram illustrating a cross-sectional structure of an example hard mask, consistent with some embodiments of this disclosure.

Technical solutions disclosed in the embodiments of the present disclosure will be described with reference to the accompanying drawings in the embodiments of the present disclosure. It is apparent that the described embodiments are merely some of, rather than all, the embodiments of the present disclosure. Based on the embodiments of the present disclosure, all other embodiments derived by those of ordinary skill in the art without creative efforts fall within the protection scope of the present disclosure.

The terms used in the embodiments of the present disclosure are for the purpose of describing particular embodiments only, and are not intended to limit the present disclosure. The singular forms "a," "said," and "the" used in the embodiments of the present disclosure and the appended claims are also intended to include plural forms, unless other meanings are clearly indicated in the context. "Plurality" includes at least two. In addition, references to "one embodiment" are not intended to be interpreted as excluding the existence of additional embodiments that also incorporate the recited features. It should be noted that, the relational terms herein such as "first" and "second" are used only to differentiate an entity or operation from another entity or operation, and do not require or imply any actual relationship or sequence between these entities or operations.

It should be understood that the term "and/or" used herein is only an association relationship describing associated objects, which means that there can be three relationships. For example, A and/or B can mean three cases that A exists alone, both A and B exist, and B exists alone. In addition, the character "/" herein generally means that the associated objects before and after it are in an "or" relationship. As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Depending on the context, the words "if" and "supposing" as used herein can be interpreted as "at the time of" or "when" or "in response to determination" or "in response to detection." Similarly, depending on the context, the phrase "if determined" or "if detected (stated condition or event)" can be interpreted as "when determined" or "in response to determination" or "when detected (stated condition or event)" or "in response to detection (stated condition or event)."

Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. In the absence of more limitations, an element defined by "including a/an . . . " does not exclude that the commodity or system including the element further has other identical elements.

In addition, the sequence of steps in the following method embodiments is only an example, rather than a strict limitation.

A Josephson junction has a sandwich structure, in which two layers of superconducting materials can be separated by an ultra-thin insulator (e.g., a dielectric layer of a few nanometers). The electrical performance of the Josephson junction at a low temperature can be a nonlinear inductance element, which can be an element for preparing quantum superconducting bits. The generation of Josephson junctions can be important for application of superconducting quantum circuits.

Manufacturing technology of a Josephson junction includes the Dolan-bridge technology that specifically uses two layers of electron beam photoresist (e.g., functioning as a resistor) to form a bridge structure, so that superconducting materials can be deposited at two different projection angles under the bridge to form the Josephson junction. The electron beam photoresist can be polymethyl methacrylate (PMMA) electron beam photoresist, which is an organic polymer material that can be exposed by electron beams to form a specific hollow pattern.

Forming the Josephson junction through the Dolan-bridge technology based on electron beam photoresist can be stable and repeatable. The Dolan-bridge technology has been applied to the manufacture of aluminum-based quantum circuits. However, although aluminum can be deposited at a room temperature, the Dolan-bridge technology has some strict requirements for manufacturing conditions described as follows. Because of the material of the electron beam photoresist, the temperature of the entire process of preparing the Josephson junction needs to be maintained below 80° C., which can be referred to as a "low temperature requirement." Also, because a bridge structure can be formed between the two layers of electron beam photoresist, to ensure the stability and non-deformation of the bridge structure, the Dolan-bridge technology that forms the bridge structure cannot be strongly processed, which can be referred to as a "low bombardment requirement." Further, because of the material features of the electron beam photoresist, gas can be generated in an ultra-high vacuum environment, which can destroy the ultra-high vacuum environment, which can be referred to as a "non-cleaning requirement." Therefore, the electron beam photoresist is not suitable for a deposition process that requires ultra-high vacuum in some cases. Also, the use range of soft templates can be limited to a preparation process of one material (e.g., aluminum), and more high-performance superconducting materials cannot be used effectively.

Embodiments of this disclosure provide technical solutions to solve the above-described technical problems, involving preparing a hard mask, preparing a Josephson junction, and providing a superconducting circuit. In example embodiments, the hard mask can be a mask plate made of a high-density inorganic material resistant to high temperature. The mask plate can be used to prepare a Josephson junction. The disclosed technical solutions can improve the selectivity of process materials and the universality of process conditions based on the hard mask, which reduces or eliminates the above-described restrictive requirements in the preparation process of the Josephson junction. Specifically, the hard mask can withstand processing temperatures of up to 1,000° C. and a variety of surface treatment processes, and can be compatible with an ultra-high vacuum environment. Also, the hard mask can be applied to a strong treatment process (e.g., annealing, removal of adhesive residues, or substrate surface reconstruction) before and after materials being deposited. The disclosed technical solutions can effectively improve quality and efficiency of the preparation of the Josephson junction and increase process diversity and process compatibility of the preparation of the Josephson junction.

For ease of discussion, some examples are described below with reference to methods, systems, devices, and/or non-transitory computer-readable media, with the understanding that discussions of each apply equally to the others. For example, some aspects of methods can be implemented by a computing device or software running thereon. Other aspects of such methods can be implemented over a network (e.g., a wired network, a wireless network, or both). Some implementations of the present specification are described in detail below with reference to the drawings. When there is no conflict between the various embodiments, the following embodiments and the features in the embodiments can be combined with each other.

FIG. 1 is a schematic diagram illustrating a cross-sectional structure of an example hard mask 1000, consistent with some embodiments of this disclosure. Hard mask 1000 can be used for preparing a Josephson junction. Referring to FIG. 1, hard mask 1000 can include a silicon oxide layer 101 and a silicon nitride layer 102. Silicon oxide layer 101 can be provided on a bare silicon wafer 100. Silicon nitride layer 102 can be provided on silicon oxide layer 101. Then, silicon nitride layer 102 and silicon oxide layer 101 can be etched to form patterns for preparing a Josephson junction. In FIG. 1, as an example, silicon nitride layer 102 is provided with a first pattern 1021, and silicon oxide layer 101 is provided with a second pattern 1011 corresponding to first pattern 1021. First pattern 1021 and second pattern 1011 have different shapes, and first pattern 1021 and second pattern 1011 can assist in forming a Josephson junction on bare silicon wafer 100.

In some embodiments, silicon oxide layer 101 can be formed by a silicon oxide $SiO_x$ material. For example, the silicon oxide $SiO_x$ material can include at least one of a silicon monoxide SiO material, a silicon dioxide $SiO_2$ material, a silicon trioxide $SiO_3$ material, or a silicon tetraoxide $SiO_4$ material. Different silicon oxide materials can be used to form silicon oxide layer 101 in accordance with specific application requirements.

In some embodiments, silicon nitride layer 102 can be formed by a silicon nitride $SiN_x$ material. For example, the silicon nitride $SiN_x$ material can include a tri-silicon tetranitride $Si_3N_4$ material. Other materials can also be used to form silicon oxide layer 101 and silicon nitride layer 102 in accordance with application requirements and design requirements.

It should be noted that the present disclosure does not limit thickness of silicon oxide layer 101, and the thickness of silicon oxide layer 101 can be set in accordance with application requirements and design requirements. For example, the thickness of silicon oxide layer 101 can be greater than or equal to 200 nanometers (nm) and smaller than or equal to 800 nm. As examples, the thickness of silicon oxide layer 101 can be 200 nm, 300 nm, 400 nm, or any thickness value. It should also be noted that the present disclosure does not limit thickness of silicon nitride layer 102, and the thickness of silicon nitride layer 102 can be set in accordance with application requirements and design requirements. For example, the thickness of silicon nitride layer 102 can be greater than or equal to 400 nm and smaller than or equal to 1,400 nm. As examples, the thickness of silicon nitride layer 102 can be 400 nm, 500 nm, 600 nm, or any thickness value.

In some embodiments, when silicon nitride layer 102 is provided with first pattern 1021 and silicon oxide layer 101 is provided with second pattern 1011, first pattern 1021 can be formed on silicon nitride layer 102 first, and then second pattern 1011 can be formed on silicon oxide layer 101 based on first pattern 1021. In such cases, a line width size of second pattern 1011 can be greater than or equal to a line width size of first pattern 1021. In some embodiments, both the line width size of first pattern 1021 and the line width size of second pattern 1011 can be greater than or equal to 100 nm.

In some embodiments, when silicon nitride layer 102 is provided with first pattern 1021, to ensure stability and reliability of formation of first pattern 1021, a stress of silicon nitride layer 102 can be controlled to be smaller than or equal to a preset threshold. It should be noted that the stress of silicon nitride layer 102 can be related to a ratio of a nitrogen material to a silicon material in silicon nitride layer 102. In some embodiments, when the stress of silicon nitride layer 102 is greater than the preset threshold, the stress of silicon nitride layer 102 can be adjusted by adjusting the ratio of the nitrogen material to the silicon material in silicon nitride layer 102. The stress of silicon nitride layer 102 can also be adjusted in another way, as long as it can ensure that the stress of silicon nitride layer 102 is smaller than or equal to the preset threshold.

In some embodiments, silicon oxide layer 101 and silicon nitride layer 102 can form hard mask 1000 that can be applied to materials with processing temperatures higher than 1,000° C. and a variety of surface treatment processes. Hard mask 1000 can also be compatible with an ultra-high vacuum environment. In a process of preparing a Josephson junction using hard mask 1000, hard mask 1000 can be applied to a strong treatment process (e.g., annealing, removal of adhesive residues, or substrate surface reconstruction) before and after materials being deposited. By doing so, not only the quality and efficiency of preparing the Josephson junction can be increased, but also the process diversity and process compatibility of the preparation of the Josephson junction can also be improved, in which the stability and reliability of using hard mask 1000 can be effectively enhanced.

Figure 2:
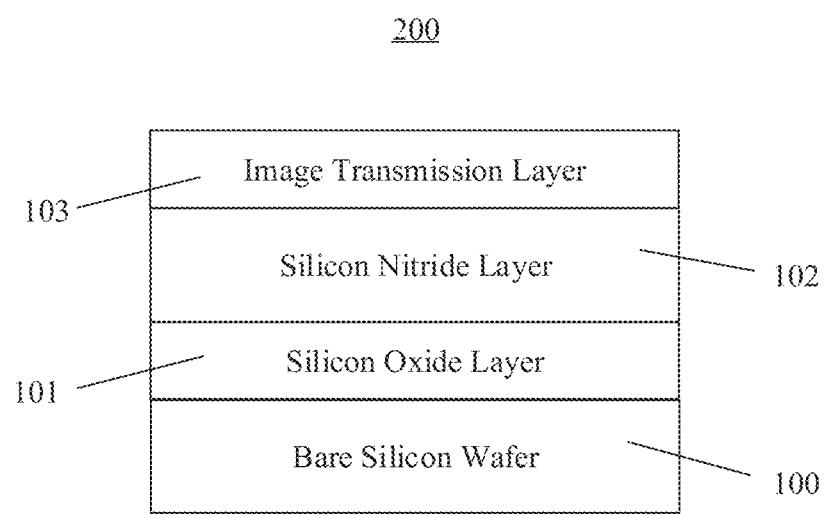
FIG. 2 is a schematic structural diagram of an example hard mask, consistent with some embodiments of this disclosure.
Figure 3:
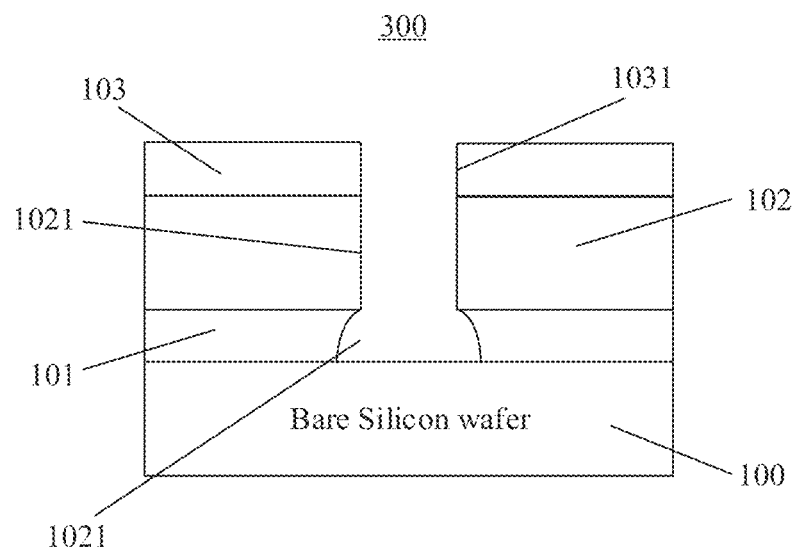
FIG. 3 is a schematic diagram illustrating a cross-sectional structure of the hard mask of FIG. 2.

By way of example, FIG. 2 is a schematic structural diagram of an example hard mask 200, consistent with some embodiments of this disclosure. FIG. 3 is a schematic diagram illustrating a cross-sectional structure 300 of hard mask 200 of FIG. 2. Referring to FIGS. 2-3, compared with hard mask 1000 of FIG. 1, hard mask 200 can include an image transmission layer 103 provided on silicon nitride layer 102. Image transmission layer 103 can be provided with a third pattern 1031 (as illustrated in FIG. 3) that can assist forming first pattern 1021 corresponding to third pattern 1031 on silicon nitride layer 102.

In some embodiments, image transmission layer 103 can transmit an image to silicon nitride layer 102. The present disclosure does not limit any material for forming image transmission layer 103, and such material can be selected in accordance with specific application requirements. For example, image transmission layer 103 can be formed by a chromium material. Also, the present disclosure does not limit thickness of image transmission layer 103, and such thickness can be set in accordance with application requirements and design requirements. For example, thickness of image transmission layer 103 can be greater than or equal to 15 nm and smaller than or equal to 50 nm.

In some embodiments, because image transmission layer 103 is provided on silicon nitride layer 102, when configuring a pattern on silicon nitride layer 102, third pattern 1031 can be provided on image transmission layer 103 first. In some embodiments, a line width size of third pattern 1031 can be the same as a line width size of first pattern 1021. For example, when the line width size of first pattern 1021 is greater than or equal to 100 nm, the line width size of third pattern 1031 can also be greater than or equal to 100 nm.

In some embodiments, to provide third pattern 1031 on image transmission layer 103, an electron beam photoresist layer (not shown in FIGS. 2-3) can be provided on image transmission layer 103 first. The electron beam photoresist layer can be etched to obtain a pattern to be transmitted, and then third pattern 1031 can be provided on image transmission layer 103 based on the pattern to be transmitted. Then, first pattern 1021 can be provided on silicon nitride layer 102 based on third pattern 1031, and second pattern 1011 can be provided on silicon oxide layer 101 based on first pattern 1021. Hard mask 200 can be formed, which includes image transmission layer 103, silicon nitride layer 102, and silicon oxide layer 101. By doing so, not only the stability and reliability of generation of hard mask 200 can be increased, but also the flexibility and diversity of generation of hard mask 200 can be expanded. A Josephson junction (not shown in FIGS. 2-3) can then be formed using hard mask 200.

Figure 4:
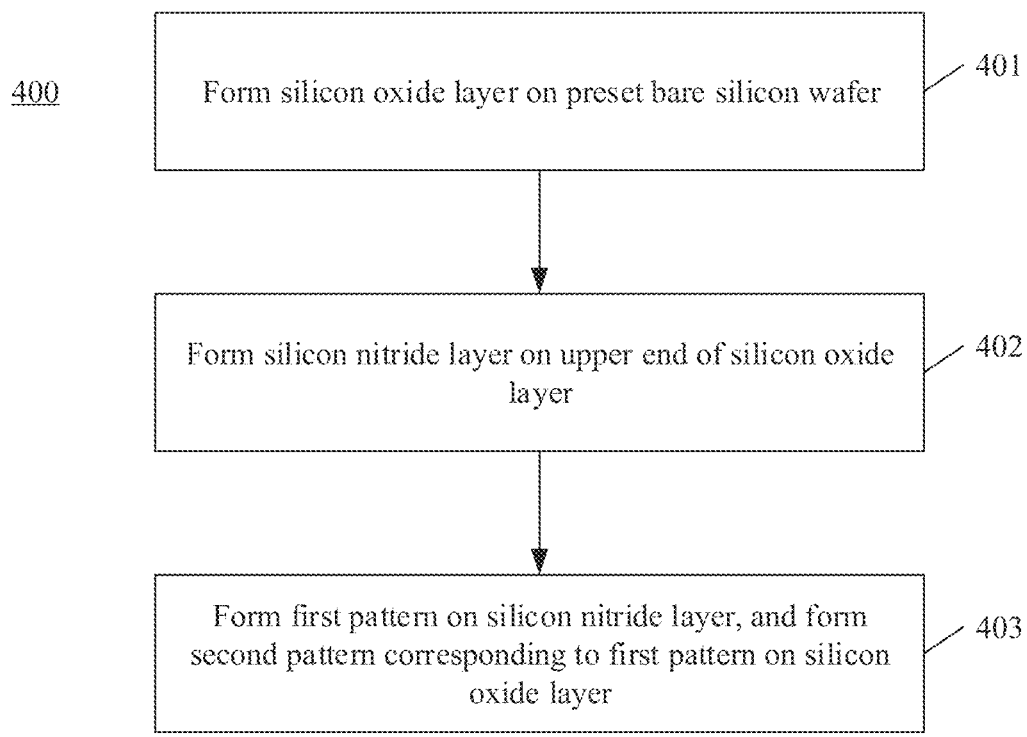
FIG. 4 is a flowchart illustrating an example method for preparing a hard mask, consistent with some embodiments of this disclosure.

By way of example, FIG. 4 is a flowchart illustrating an example method 400 for preparing a hard mask (e.g., hard mask 1000 of FIG. 1), consistent with some embodiments of this disclosure. It should be noted that hard masks with different structures can correspond to different preparation methods. Referring to FIG. 4, method 400 can include the following steps.

At step 401, a silicon oxide layer (e.g., silicon oxide layer 101 in FIG. 1) can be formed on a preset bare silicon wafer (e.g., bare silicon wafer 100 in FIG. 1). The present disclosure does not limit a size of the bare silicon wafer. For example, the size of the bare silicon wafer can be large or small, which can be set in accordance with application requirements and design requirements. In addition, the present disclosure does not limit thickness of the silicon oxide layer, which can be configured in accordance with application requirements and design requirements. For example, the thickness of the silicon oxide layer can be greater than or equal to 200 nm and smaller than or equal to 800 nm. As examples, the thickness of the silicon oxide layer can be 200 nm, 300 nm, 400 nm, or any value.

In some embodiments, the silicon oxide layer can be formed on the bare silicon wafer after the bare silicon wafer being obtained. For example, the silicon oxide layer can be formed by a dry oxidation method. It should be noted that the silicon oxide layer can also be generated in another way, as long as it can ensure that the silicon oxide layer is stably formed on the bare silicon wafer.

At step 402, a silicon nitride layer (e.g., silicon nitride layer 102 in FIG. 1) can be formed on the silicon oxide layer.

In some embodiments, after the silicon oxide layer is formed on the preset bare silicon wafer, a silicon nitride layer can be formed on the silicon oxide layer. For example, the silicon nitride layer can be formed on the silicon oxide layer through Low Pressure Chemical Vapor Deposition (LPCVD), in which the LPCVD can be a thin-film growth technology for forming silicon nitride. It should be noted that the silicon nitride layer can also be generated in another way as long as it can ensure that the silicon nitride layer is stably formed on the silicon oxide layer.

In should be noted that the present disclosure does not limit thickness of the silicon nitride layer, and the thickness of the silicon nitride can be configured in accordance with application requirements and design requirements. For example, the thickness of the silicon nitride layer can be greater than or equal to 400 nm and smaller than or equal to 1,400 nm. As examples, the silicon nitride layer can be 400 nm, 500 nm, or 600 nm.

At step 403, a first pattern (e.g., first pattern 1021 in FIG. 1) can be formed on the silicon nitride layer, and a second pattern (e.g., second pattern 1011 in FIG. 1) corresponding to the first pattern can be formed on the silicon oxide layer. The silicon nitride layer with the first pattern and the silicon oxide layer with the second pattern can form a hard mask (e.g., hard mask 1000 in FIG. 1), in which the first pattern and the second pattern can have different shapes and assist in forming a Josephson junction on the bare silicon wafer.

In some embodiments, to form the first pattern on the silicon nitride layer at step 403, the silicon nitride layer can be anisotropically etched to form the first pattern on the silicon nitride layer. The anisotropic etching can include an etching method in which different etching rates are exhibited on different crystallographic planes. It should be noted that the present disclosure does not limit any implementation of anisotropically etching the silicon nitride layer to form the first pattern on the silicon nitride layer, and such implementations can be set in accordance with application requirements and design requirements.

For example, to form the first pattern on the silicon nitride layer by anisotropically etching the silicon nitride layer, the silicon nitride layer can be anisotropically etched using an inductively coupled etching device to form the first pattern on the silicon nitride layer. For example, after the silicon nitride layer is obtained, the silicon nitride layer can be transferred to the inductively coupled etching device. The silicon nitride layer can be anisotropically etched in a preset environment (e.g., an $SF_6/O_2$ environment), so that the first pattern can be formed on the silicon nitride layer. It should be noted that by controlling the length of time during which an anisotropic etching operation is performed on the silicon nitride layer in the preset environment, the size of the first pattern can be adjusted.

As another example, to form the first pattern on the silicon nitride layer by anisotropically etching the silicon nitride layer, the silicon nitride layer can be anisotropically etched based on a reactive ion etching method to form the first pattern on the silicon nitride layer. The reactive ion etching technology can include a dry etching technology with strong anisotropy and selectivity. For example, the silicon nitride layer can be etched using molecular gas plasma in a vacuum environment, and anisotropic etching can be implemented using ion-induced chemical reactions. In an example, ion energy can be used to form a damage layer with ease of etching on the surface of the etched layer to promote chemical reactions. By doing so, the first pattern can be formed on the silicon nitride layer. In addition, in the process of forming the first pattern, the generated ions can also remove products on the surface to expose a clean etched surface.

It should be noted that the specific implementation of anisotropically etching the silicon nitride layer to form the first pattern on the silicon nitride layer is not limited to the above-described examples, and the first pattern can also be formed on the silicon nitride layer in another way, as long as it can ensure that the first pattern is formed stably on the silicon nitride layer.

In some embodiments, to form the hard mask, a first pattern can be formed on the silicon nitride layer, and a second pattern corresponding to the first pattern can be formed on the silicon oxide layer, in which the first pattern and the second pattern can have different shapes. The first pattern and the second pattern can assist in forming the Josephson junction on the bare silicon wafer.

In some embodiments, when the silicon nitride layer is formed on the silicon oxide layer, a first pattern can be formed on the silicon nitride layer, and a second pattern corresponding to the first pattern can be formed on the silicon oxide layer. To form the hard mask, the first pattern and the second pattern can have different shapes, and the first pattern and the second pattern can assist in forming the Josephson junction on the bare silicon wafer.

In some embodiments, when providing the first pattern on the silicon nitride and the second pattern on the silicon oxide layer, the first pattern can be formed on the silicon nitride layer first, and then the second pattern can be formed on the silicon oxide layer based on the first pattern. In such cases, for example, a line width size of the second pattern can be greater than or equal to a line width size of the first pattern. In an example, the line width size of the first pattern can be greater than or equal to 100 nm, and the line width size of the second pattern can also be greater than or equal to 100 nm.

It should be noted that the present disclosure does not limit any implementation of forming the first pattern on the silicon nitride layer, and such implementations can be set in accordance with application requirements and design requirements. In some embodiments, forming the first pattern on the silicon nitride layer at step 403 can include the following operations.

As described in association with FIG. 4, in accordance with the method for preparing the hard mask provided in the present disclosure, a silicon oxide layer can be formed on a preset bare silicon wafer, a silicon nitride layer can be formed on the silicon oxide layer, a first pattern can be formed on the silicon nitride layer, and a second pattern corresponding to the first pattern can be formed on the silicon oxide layer. The first pattern and the second pattern can have different shapes, and the first pattern and the second pattern can assist in forming a Josephson junction on the bare silicon wafer. By doing so, a hard mask can be effectively generated for preparing the Josephson junction, and the practicability of the preparation method can be increased.

By way of example, FIG. 5 is a flowchart illustrating another example method 500 for preparing a hard mask, consistent with some embodiments of this disclosure. At step 501, stress information of the silicon nitride layer can be acquired. At step 502, when the stress information is greater than a preset stress threshold, a ratio between a nitrogen material and a silicon material in the silicon nitride layer can be adjusted so that the stress information is smaller than or equal to the preset stress threshold.

In some embodiments, when providing the first pattern on the silicon nitride layer, to ensure the stability and reliability of formation of the first pattern, the stress of the silicon nitride layer can be controlled to be smaller than or equal to a preset threshold. It should be noted that the stress of the silicon nitride layer can be related to a ratio of a nitrogen material to a silicon material in the silicon nitride layer. Therefore, after obtaining the ratio of the nitrogen material and the silicon material in the silicon nitride layer, the stress of the silicon nitride layer can be acquired in accordance with a preset mapping relationship between the ratio and the stress.

In some embodiments, the stress of the silicon nitride layer can be analyzed and compared with the preset threshold. When the stress of the silicon nitride layer is greater than the preset threshold, the stress of the silicon nitride layer can be adjusted by adjusting the ratio of the nitrogen material and the silicon material in the silicon nitride layer. It should be noted that the stress of the silicon nitride layer can also be adjusted in another ways, as long as it can ensure that the stress of the silicon nitride layer is smaller than or equal to the preset threshold.

As described in association with FIG. 5, stress of the silicon nitride layer can be acquired, when the stress information is greater than a preset stress threshold, a ratio between the nitrogen material and the silicon material in the silicon nitride layer can be adjusted so that the stress information is smaller than or equal to the preset stress threshold. By doing so, the quality and efficiency of forming the first pattern on the silicon nitride layer can be increased, and the accuracy and reliability of using the hard mask can be improved.

By way of example, FIG. 6A is a flowchart illustrating an example method 600A for forming a first pattern on a silicon nitride layer, consistent with some embodiments of this disclosure. It should be noted that the present disclosure does not limit any specific implementation of forming the first pattern on the silicon nitride layer, and such specific implementation can be set in accordance with application requirements and design requirements.

Referring to FIG. 6A, at step 601, an image transmission layer can be formed on the silicon nitride layer. It should be noted that the present disclosure does not limit any specific material for forming the image transmission layer, and such material can be set in accordance with application requirements. For example, the image transmission layer can be formed by a chromium material. It should also be noted that the present disclosure does not limit thickness of the image transmission layer, and such thickness can be set in accordance with application requirements and design requirements. As an example, thickness of the image transmission layer can be greater than or equal to 15 nm and smaller than or equal to 50 nm.

At step 602, a third pattern can be formed on the image transmission layer. In some embodiments, because the image transmission layer can be provided on the silicon nitride layer, when configuring a pattern on the silicon nitride layer, the third pattern can be provided on the image transmission layer first. The third pattern can assist in forming the first pattern corresponding to the third pattern on the silicon nitride. It should be noted that a line width size of the third pattern can be the same as a line width size of the first pattern. For example, when the line width size of the first pattern is greater than or equal to 100 nm, the line width size of the third pattern can also greater than or equal to 100 nm.

Figure 6B:
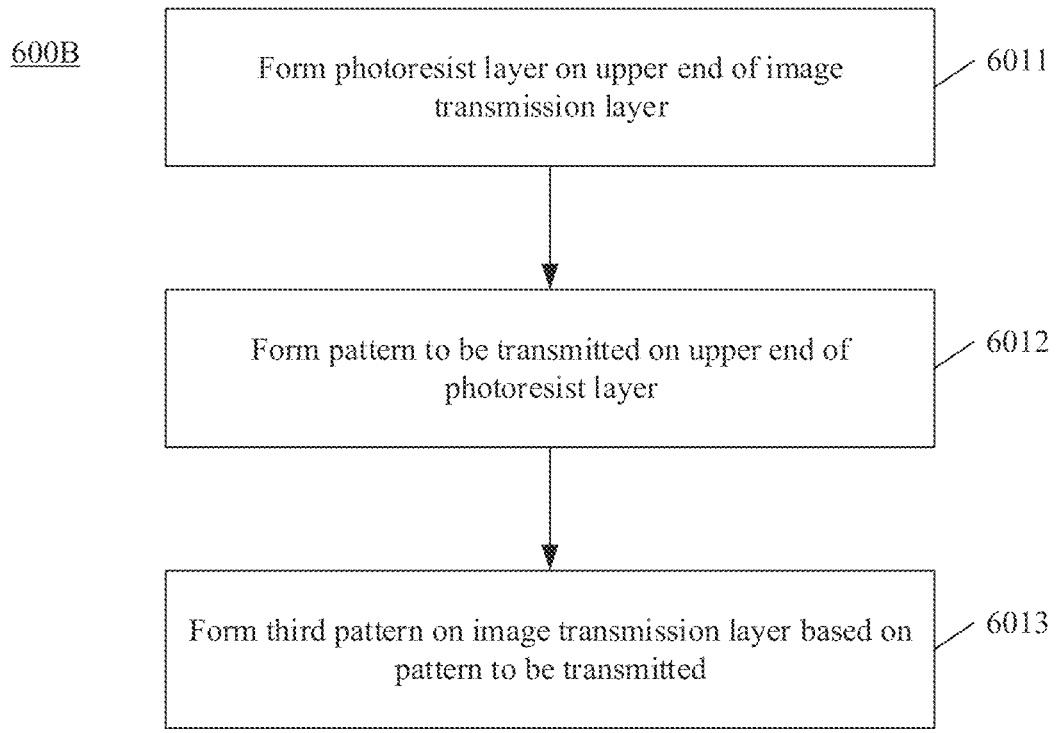
FIG. 6B is a flowchart illustrating an example method for forming a pattern on an image transmission layer, consistent with some embodiments of this disclosure.

In some embodiments, to form the third pattern on the image transmission layer, step 602 can include further steps. By way of example, FIG. 6B is a flowchart illustrating an example method 600B for forming a pattern on an image transmission layer, consistent with some embodiments of this disclosure. Referring to FIG. 6B, at step 6011, a photoresist layer can be formed on the image transmission layer. For example, to provide the third pattern on the image transmission layer, at step 6011, an electron beam photoresist layer can be provided on the image transmission layer first.

At step 6012, a pattern to be transmitted can be formed on the photoresist layer. For example, a pattern to be transmitted can be obtained through etching on the electron beam photoresist layer.

At step 6013, the third pattern can be formed on the image transmission layer based on the pattern to be transmitted. For example, the third pattern corresponding to the pattern to be transmitted can be provided on the image transmission layer based on the pattern to be transmitted.

Referring back to FIG. 6A, at step 603, the first pattern can be formed on the silicon nitride layer based on the third pattern. In some embodiments, after step 603, with reference to FIG. 4, a second pattern corresponding to the first pattern can be provided on the silicon oxide layer based on the first pattern, by which a hard mask can be generated. The hard mask can include the image transmission layer, the silicon nitride layer, and the silicon oxide layer. The hard mask can be used to configure a Josephson junction.

As described in association with FIGS. 6A-6B, the image transmission layer can be provided on the silicon nitride layer, and the third pattern on the image transmission layer can assist in forming the first pattern corresponding to the third pattern on the silicon nitride. Such a technical solution cannot only increase the stability and reliability of generating the hard mask but also expand the flexibility and diversity of generating the hard mask.

Figure 7:
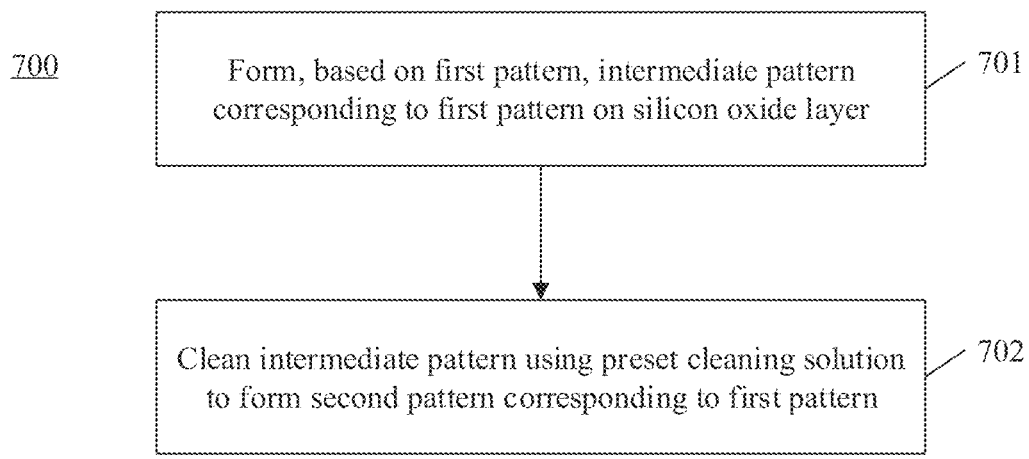
FIG. 7 is a flowchart illustrating an example method for forming a second pattern corresponding to the first pattern of FIG. 6A on the silicon oxide layer, consistent with some embodiments of this disclosure.

By way of example, FIG. 7 is a flowchart illustrating an example method 700 for forming a second pattern corresponding to the first pattern of FIG. 6A on the silicon oxide layer, consistent with some embodiments of this disclosure. It should be noted that the present disclosure does not limit any implementation of forming the second pattern corresponding to the first pattern on the silicon oxide layer, and such implementations can be set in accordance with application requirements and design requirements.

Referring back to FIG. 6A, at step 701, an intermediate pattern corresponding to a first pattern (e.g., first pattern 1021 in FIG. 1) can be formed on a silicon oxide layer (e.g., silicon oxide layer 101 in FIG. 1) based on the first pattern. A distance between the intermediate pattern and a bare silicon wafer (e.g., bare silicon wafer 100 in FIG. 1) can be greater than zero. In some embodiments, after the first pattern is formed on a silicon nitride layer (e.g., silicon nitride layer 102 in FIG. 1), the intermediate pattern corresponding to the first pattern can be formed on the silicon oxide layer based on the first pattern. In some embodiments, a line width size of the intermediate pattern can be smaller than or equal to a line width size of the first pattern, and a distance between the intermediate pattern and the bare silicon wafer can be greater than zero.

At step 702, the intermediate pattern can be cleaned using a preset cleaning solution to form a second pattern (e.g., second pattern 1011 in FIG. 1) corresponding to the first pattern. The second pattern and the intermediate pattern can have different shapes. In some embodiments, after the intermediate pattern is formed, a cleaning solution can be used to perform a cleaning operation on the intermediate pattern. For example, the cleaning solution can include at least one of a hydrofluoric acid (HF) solution or a buffered hydrofluoric acid (BHF) solution.

In some embodiments, when the intermediate pattern is cleaned using the preset cleaning solution, the second pattern corresponding to the first pattern can be formed. The second pattern and the intermediate pattern can have different shapes. For example, the second pattern can include an undercut structure generated by the cleaning operation of the cleaning solution. The undercut structure can ensure that when a preset material is formed, the preset material does not touch a side wall. Doing so can avoid difficulty of removing the preset material when it touches the side wall and ensure the smoothness of the formed structure.

As described in association with FIG. 7, an intermediate pattern corresponding to the first pattern can be formed on the silicon oxide layer based on the first pattern, and the intermediate pattern can be cleaned using a preset cleaning solution to form a second pattern corresponding to the first pattern. By doing so, the second pattern corresponding to the first pattern can be effectively formed on the silicon oxide layer for preparing a hard mask.

Figure 8:
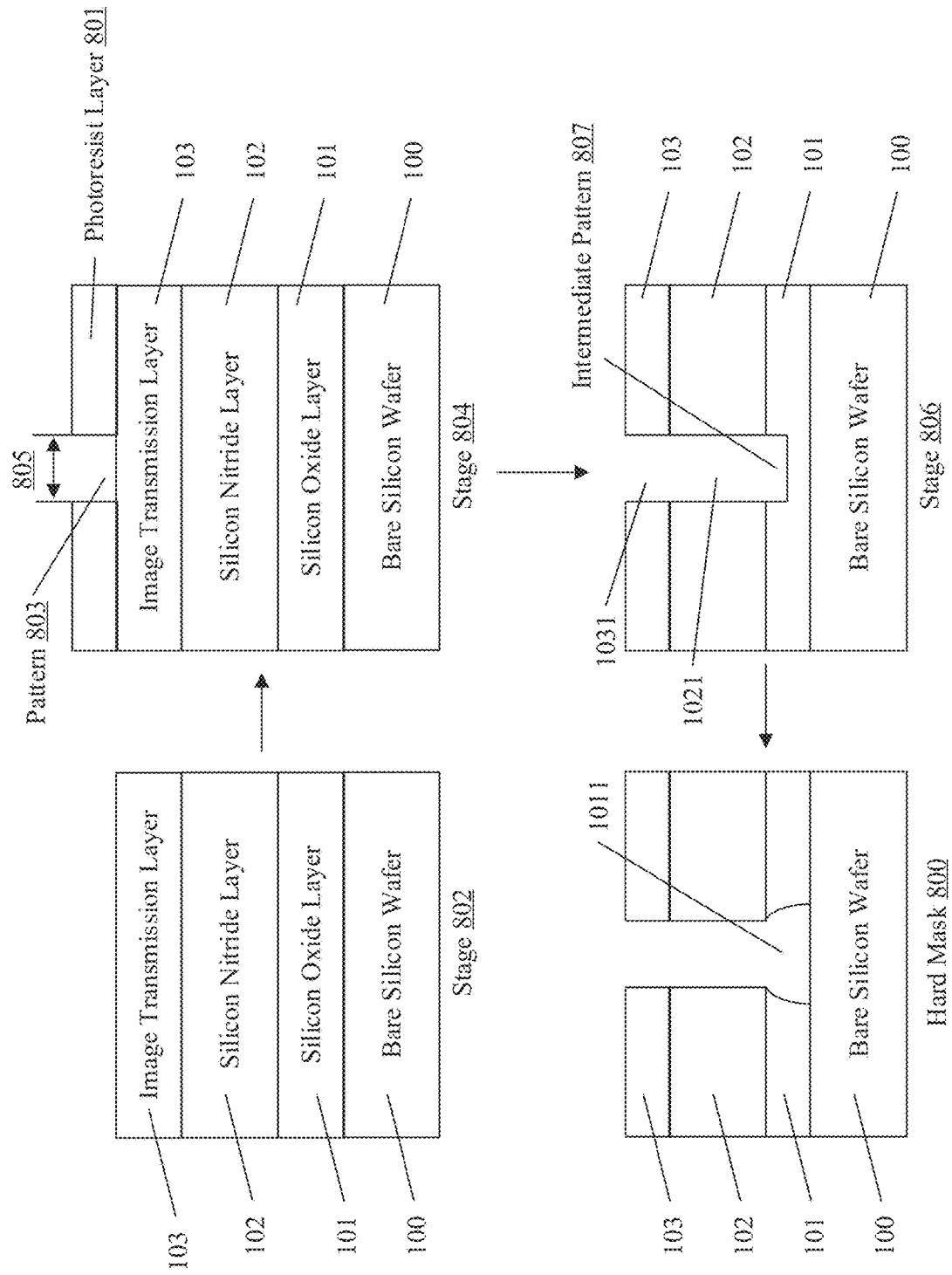
FIG. 8 is a schematic diagram illustrating an example application scenario of preparing a hard mask, consistent with some embodiments of this disclosure.

By way of example, FIG. 8 is a schematic diagram illustrating an example application scenario of preparing a hard mask 800, consistent with some embodiments of this disclosure. In FIG. 8, hard mask 800 including a silicon oxide layer 101, a silicon nitride layer 102, and an image transmission layer 103. Forming hard mask 800 can include the following stages.

At stage 802, silicon oxide layer 101 can be generated on a bare silicon wafer 100. For example, a 200 nm thick silicon oxide layer 101 can be generated on bare silicon wafer 100 by dry oxidation. Silicon nitride layer 102 can be formed on silicon oxide layer 101. For example, a 400 nm thick low-stress silicon nitride layer 102 can be deposited on silicon oxide layer 101 using an LPCVD method. Image transmission layer 103 can be formed on silicon nitride layer 102. For example, a 15 nm thick chromium layer can be obtained by electron beam evaporation to form image transmission layer 103. In some embodiments, silicon oxide layer 101 can function as a protective and sacrificial layer, and silicon nitride layer 102 can be used to form hard mask 800.

At stage 804, a photoresist layer 801 can be configured on image transmission layer 103, and a pattern to be transmitted (referred to as "pattern 803" and illustrated in FIG. 8) can be obtained through etching on photoresist layer 801. For example, to form hard mask 800, photoresist layer 801 (e.g., PMMA) can be spin-coated, exposed, and developed to form pattern 803 with a feature size 805 (e.g., a minimum line width of 100 nm).

At stage 806, a pattern etching stage can be performed on image transmission layer 103 based on pattern 803 to generate a third pattern 1031 corresponding to pattern 803. For example, image transmission layer 103 can be wet-etched with a limited line width for generating third pattern 1031. In some embodiments, third pattern 1031 can have the same line width size as pattern 803.

Still at stage 806, image transmission layer 103, silicon nitride layer 102, and silicon oxide layer 101 can be transferred to an inductively coupled etching device (not shown in FIG. 8) to generate first pattern 1021 corresponding to third pattern 1031 on silicon nitride layer 102. For example, silicon nitride layer 102 can be anisotropically etched in an $SF_6/O_2$ environment to generate first pattern 1021 on silicon nitride layer 102.

Still at stage 806, an intermediate pattern 807 corresponding to first pattern 1021 can be formed on silicon oxide layer 101 based on first pattern 1021. In some embodiments, intermediate pattern 807 can be cleaned using a preset cleaning solution to form second pattern 1011 corresponding to first pattern 1021. Second pattern 1011 and intermediate pattern 807 can have different shapes.

In some embodiments, when silicon oxide layer 101 is etched, the etching operation can be stopped at a distance above the surface of bare silicon wafer 100. For example, the distance between intermediate pattern 807 and bare silicon wafer 100 can be 50 m. In some embodiments, by controlling the etching time for silicon oxide layer 101, the distance between intermediate layer 807 and bare silicon wafer 100 can be adjusted. By controlling the distance between intermediate pattern 807 and bare silicon wafer 100 to be greater than zero, the surface damage to bare silicon wafer 100 can be effectively reduced or eliminated.

In some embodiments, after intermediate pattern 807 is generated, image transmission layer 103, silicon nitride layer 102, and silicon oxide layer 101 can be immersed in an HF solution, so that an undercut structure can be generated in intermediate pattern 807, and second pattern 1011 corresponding to first pattern 1021 can be formed.

As described in association with FIGS. 1-8, the provided technical solutions of forming a hard mask can have the following advantages. First, the disclosed technical solutions of forming the hard mask can be applicable to a larger temperature range. The formed hard mask in the present disclosure can withstand materials with processing temperatures of higher than 1,000° C., so that processes with a larger temperature range (e.g., high-temperature deposition, in-situ annealing, or post-annealing) can be applied to the manufacturing process of a Josephson junction.

Also, the disclosed technical solutions of forming the hard mask can be applicable to more materials. The disclosed method of preparing the hard mask is suitable for preparing a Josephson junction using not only an aluminum material but also other materials, such as binary nitrides (e.g., titanium nitride or niobium nitride), ternary nitrides (e.g., niobium titanium nitride), or any other composite oxide. Because composite oxides show similar or superior performance compared with the aluminum material, the preparation quality and efficiency of the Josephson junction can be effectively ensured, and the processing capacity of quantum information can be further improved, which can assist deeper and more comprehensive research on materials and provide research directions for basic physics or materials science.

Further, the disclosed technical solutions of forming the hard mask can be reliable and reproducible. For example, such technical solutions can be applied to bridgeless design structures and bridged design structures. When bridgeless hard mask design structures are adopted, the possibility of bridge collapse can be eliminated. The disclosed technical solutions can be further extended to prepare wafer-scale hard masks.

Moreover, the disclosed technical solutions of forming the hard mask can be applicable to surface treatment. The surface treatment technology for preparing the hard mask can be limited in prior art. In some cases, the surface treatment can adversely affect the coherence time of quantum circuits (e.g., ion milling). For example, plasma surface treatment can destroy performance of the photoresist to cause the performance of the photoresist to deviate from the design value. By applying the disclosed technical solutions of forming the hard mask, the material of the hard mask does not react to chemical or physical influence of the surface treatment, thus removing the limitation on the surface treatment and providing wider processing capacity for forming the hard mask.

In addition, the disclosed technical solutions of forming the hard mask can be compatible with ultra-high pressure. The disclosed technical solutions can be suitable for an ultra-high pressure vacuum environment because the formed hard mask does not contain any organic material in a mask layer and the degassing effect of the material is limited. Therefore, the hard mask can be applied to an ultra-high vacuum environment, thereby further improving the application range of the disclosed technical solutions.

Figure 9:
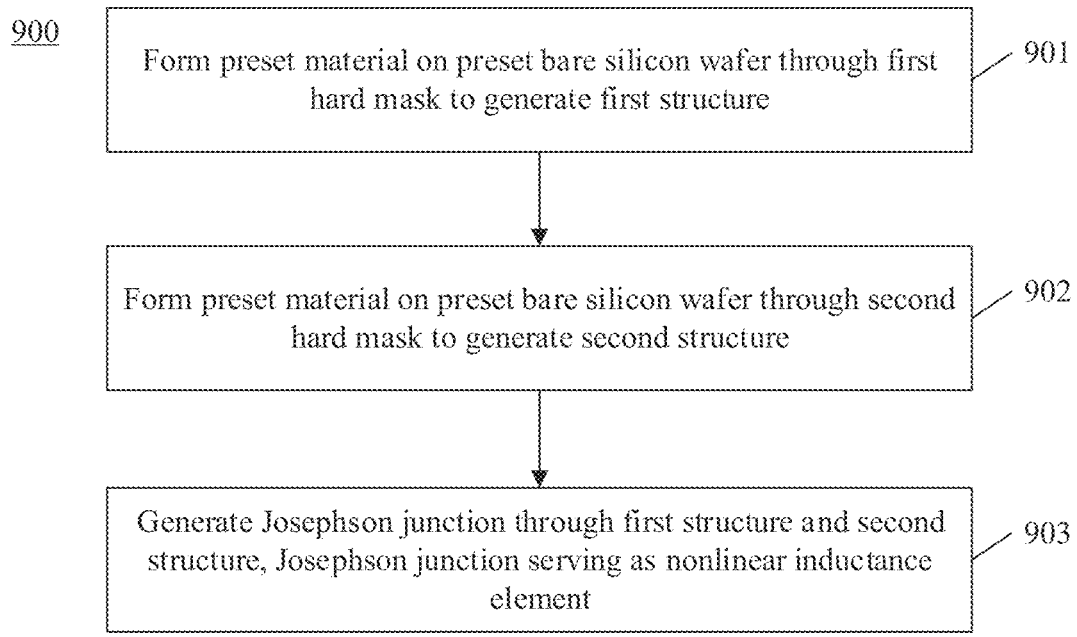
FIG. 9 is a flowchart illustrating an example method for preparing a Josephson junction, consistent with some embodiments of this disclosure.
Figure 10:
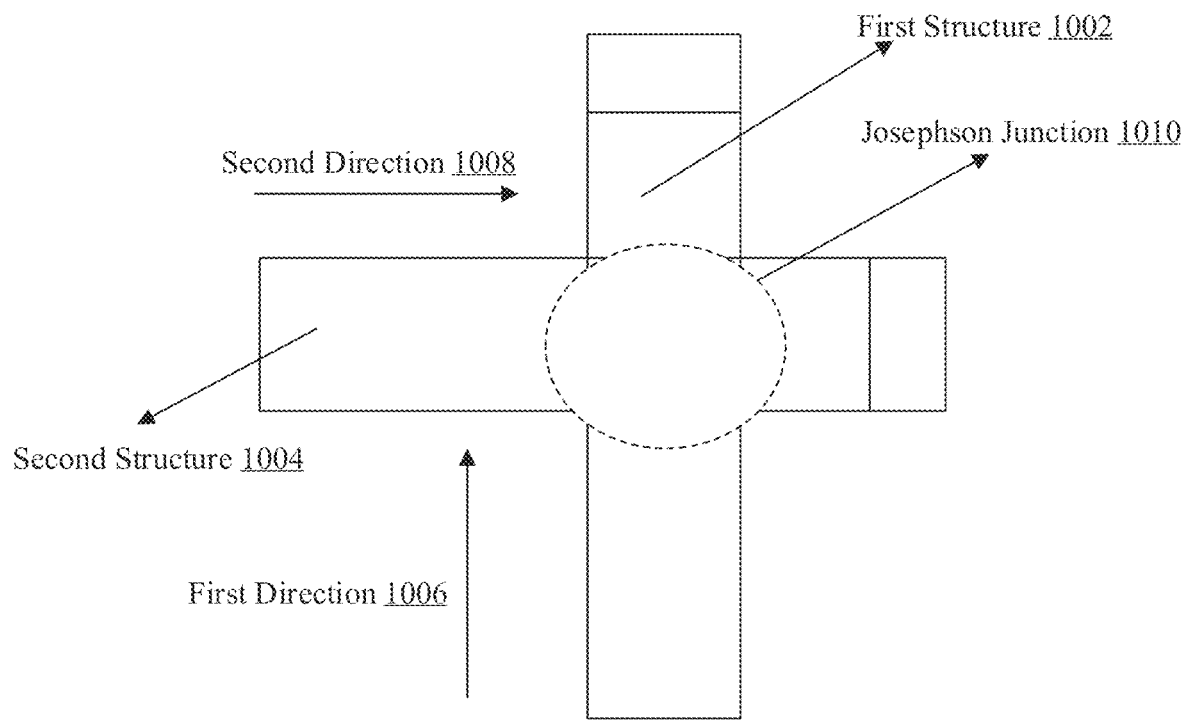
FIG. 10 is a schematic diagram illustrating generating a Josephson junction through a first structure and a second structure, consistent with some embodiments of this disclosure.

By way of example, FIG. 9 is a flowchart illustrating an example method 900 for preparing a Josephson junction, consistent with some embodiments of this disclosure. FIG. 10 is a schematic diagram illustrating generating a Josephson junction through a first structure 1002 and a second structure 1004, consistent with some embodiments of this disclosure.

Referring to FIGS. 9-10, at step 901, a preset material can be formed on a preset bare silicon wafer through a first hard mask to generate a first structure (e.g., first structure 1002). For example, the preset material can include any one of aluminum, binary nitride, ternary nitride, or any composite oxide.

At step 902, the preset material can be formed on the preset bare silicon wafer through a second hard mask to generate a second structure (e.g., second structure 1004). The first structure and the second structure can be in different directions (e.g., a first direction 1006 and a second direction 1008 in FIG. 10). In some embodiments, the first hard mask and the second hard mask can be the same mask (e.g., an identical mask) or different masks. It should be noted that the first hard mask and the second hard mask can be hard masks prepared in advance, and the first hard mask and the second hard mask can be configured to prepare a Josephson junction.

In some embodiments, after the first hard mask and the second hard mask are obtained, the preset material can be formed on the preset bare silicon wafer based on the first hard mask to generate a first structure. In some embodiments, when the first hard mask and the second hard mask are the same mask, the generated first structure and second structure can be the same structure. When the first hard mask and the second hard mask are different hard masks, the generated first structure and second structure can be different structures.

At step 903, a Josephson junction (e.g., Josephson junction 1010 in FIG. 10) can be generated through the first structure and the second structure. The Josephson junction can serve as a nonlinear inductance element.

In some embodiments, to generate the Josephson junction through the first structure and the second structure, an overlapping structure formed between the first structure and the second structure can be acquired. Then, the overlapping structure can be determined as the Josephson junction. For example, the overlapping structure between the first structure and the second structure can be formed by crossing the first structure and the second structure after generating the first structure and the second structure.

In some embodiments, after the first structure and the second structure are generated, a preset angle (e.g., a non-zero angle) can be formed between the first structure and the second structure. For example, as shown in FIG. 10, first structure 1002 can be generated in first direction 1006, and second structure 1004 can be generated in second direction 1008. First direction 1006 and second direction 1008 are perpendicular to each other (e.g., at an angle of 90° between first structure 1002 and second structure 1004). Josephson junction 1010 can be obtained through the overlapping structure (represented as a dash-line ellipse) between first structure 1002 and second structure 1004.

It should be noted that the angle formed between the first structure and the second structure is not limited to the above example angle, and the angle can be set in accordance with application requirements and design requirements. As examples, angles of 30°, 45°, 135°, or 180° can be formed between the first structure and the second structure. It should be noted that the execution order of step 901 and step 902 in FIG. 9 is not limited to the order illustrated herein. For example, step 901 can be executed after step 902, and such execution orders can be set in accordance with application requirements and design requirements.

As described in association with FIGS. 9-10, a preset material can be formed on a preset bare silicon wafer through a first hard mask to generate a first structure, and the preset material can be formed on the preset bare silicon wafer through a second hard mask to generate a second structure. Because the first structure and the second structure are in different directions, a Josephson junction can be generated through the first structure and the second structure, which can effectively ensure the preparation quality and efficiency of the Josephson junction and improve the stability and reliability of use of the method.

Consistent with some embodiments of this disclosure, after the Josephson junction is generated through the first structure and the second structure, the first hard mask and the second hard mask located on the bare silicon wafer can be removed. For example, after the Josephson junction is generated, the first hard mask and the second hard mask can be removed by high-frequency vapor corrosion. It should be noted that the first hard mask and the second hard mask can be removed in another way, as long as it can ensure that the first hard mask and the second hard mask are removed stably and effectively.

By way of example, FIG. 11 is a flowchart illustrating an example method 1100 for removing a first hard mask and a second hard mask located on a bare silicon wafer, consistent with some embodiments of this disclosure.

At step 1101, when the second hard mask is located on the first hard mask, a plurality of preset patterns can be formed on the second hard mask. The plurality of preset patterns can be configured to improve the efficiency of removal of the first hard mask and the second hard mask. In some embodiments, the plurality of preset patterns can include any one of a plurality of circular hole patterns or a plurality of inclined line patterns. For example, line width sizes of the plurality of circular hole patterns can be smaller than or equal to 100 nm. As another example, the plurality of inclined line patterns can be inclined at an angle of 45° with respect to an edge of the second hard mask, and line widths of the plurality of inclined line patterns can be smaller than or equal to 100 nm.

At step 1102, the first hard mask and the second hard mask located on the bare silicon wafer can be removed based on the plurality of preset patterns.

As described in association with FIG. 11, after the Josephson junction is generated, to improve the quality and efficiency of removal of the first hard mask and the second hard mask, when the second hard mask is located on the first hard mask, a plurality of preset patterns can be formed on the second hard mask. The plurality of preset patterns can be used to improve the efficiency of removal of the first hard mask and the second hard mask. Then, the first hard mask and the second hard mask located on the bare silicon wafer can be removed based on the plurality of preset patterns. By doing so, the quality and efficiency of removal of the first hard mask and the second hard mask can be effectively improved.

Figure 12:
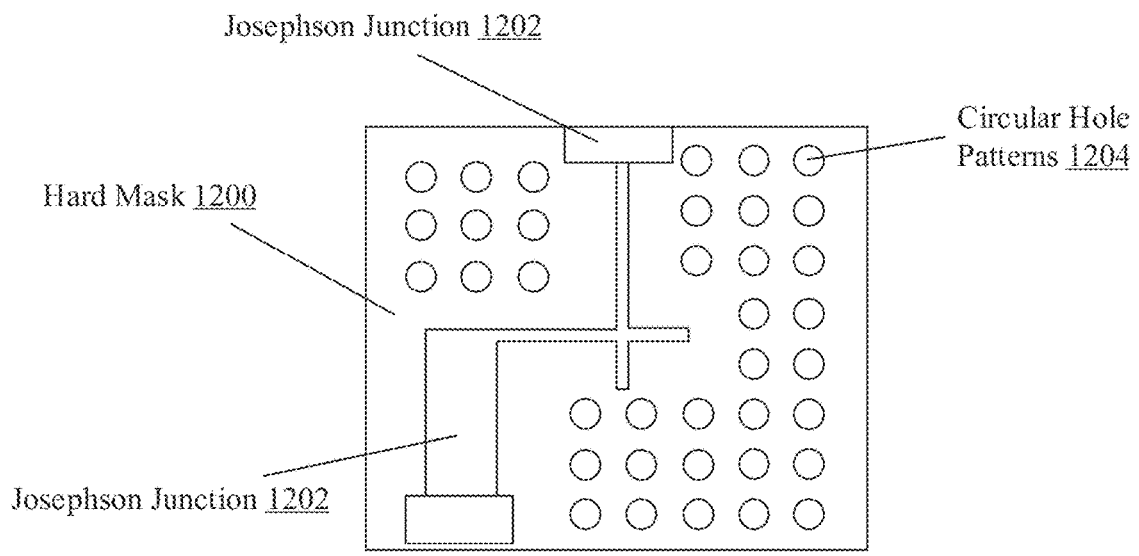
FIG. 12 is a first schematic diagram illustrating removing a first hard mask and a second hard mask located on a bare silicon wafer based on preset patterns, consistent with some embodiments of this disclosure.

By way of example, FIG. 12 is a first schematic diagram illustrating removing a first hard mask and a second hard mask located on a bare silicon wafer based on preset patterns, consistent with some embodiments of this disclosure. In FIG. 12, a hard mask 1200 can include the first hard mask and the second hard mask.

In some embodiments, with reference to FIG. 12, after hard mask 1200 is obtained, a preset material (not shown in FIG. 12) can be generated on a bare silicon wafer (not shown in FIG. 12) through mask patterns on hard mask 1200, so that a Josephson junction 1202 can be generated. An upper surface of the bare silicon wafer can include a first region where Josephson junction 1202 is located and a second region where hard mask 1200 is located. To ensure the stability and reliability of Josephson junction 1202, hard mask 1200 located in the second region on the bare silicon wafer can be removed. For example, to improve the quality and efficiency of removing hard mask 1200, a plurality of circular hole patterns 1204 can be uniformly provided on hard mask 1200. Removing hard mask 1200 in combination with circular hole patterns 1204 cannot only improve the quality and efficiency of removing hard mask 1200 but also ensure that no traces can be left on the bare silicon wafer, thereby ensuring the stability and reliability of using Josephson junction 1202.

Figure 13:
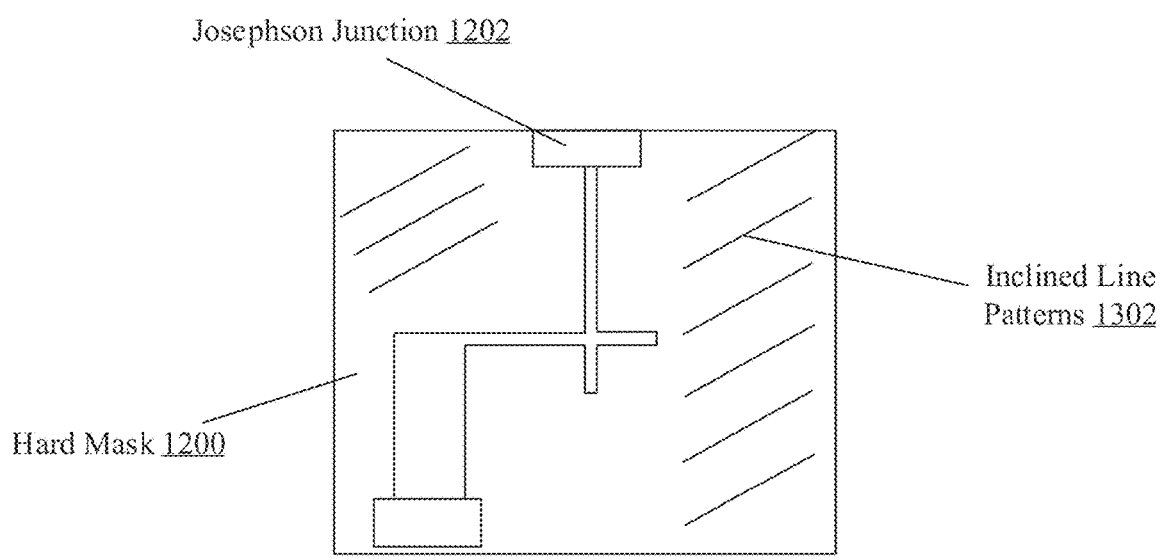
FIG. 13 is a second schematic diagram illustrating removing a first hard mask and a second hard mask located on a bare silicon wafer based on preset patterns, consistent with some embodiments of this disclosure.

As another example, FIG. 13 is a second schematic diagram illustrating removing a first hard mask and a second hard mask located on a bare silicon wafer based on preset patterns, consistent with some embodiments of this disclosure. FIG. 13 can be similar to FIG. 12 except that a plurality of inclined line patterns 1302 (instead of circular hole patterns 1204) are uniformly provided on hard mask 1200.

For example, with reference to FIG. 13, after hard mask 1200 is obtained, a preset material (not shown in FIG. 13) can be generated on a bare silicon wafer (not shown in FIG. 13) through mask patterns on hard mask 1200, so that a Josephson junction 1202 can be generated. An upper surface of the bare silicon wafer can include a first region where Josephson junction 1202 is located and a second region where hard mask 1200 is located. To ensure the stability and reliability of Josephson junction 1202, hard mask 1200 located in the second region on the bare silicon wafer can be removed. For example, to improve the quality and efficiency of removing hard mask 1200, a plurality of inclined line patterns 1302 can be uniformly provided on hard mask 1200. To avoid leaving removal traces on the bare silicon wafer, inclined line patterns 1302 can be inclined at an angle of 45° with respect to an edge of hard mask 1200 located on the bare silicon wafer. Removing hard mask 1200 in combination with inclined line patterns 1302 can not only improve the quality and efficiency of removing hard mask 1200 but also ensure that no traces can be left on the bare silicon wafer, thereby ensuring the stability and reliability of using Josephson junction 1202.

Figure 14:
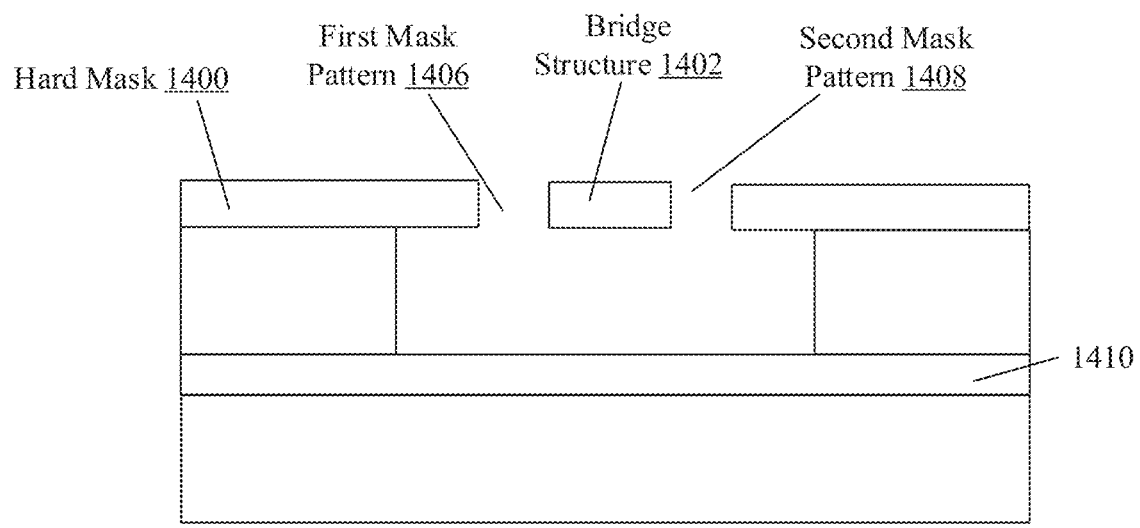
FIG. 14 is a schematic diagram of a hard mask with a bridge structure, consistent with some embodiments of this disclosure.

By way of example, FIG. 14 is a schematic diagram of a hard mask 1400 with a bridge structure 1402, consistent with some embodiments of this disclosure. In some embodiments, with reference to FIGS. 9 and 14, when a first hard mask (e.g., the first hard mask at step 901 of FIG. 9) and a second hard mask (e.g., the second hard mask at step 902 of FIG. 9) are an identical mask, the preparation process of a Josephson junction (e.g., the Josephson junction at step 903 of FIG. 9) can be implemented by hard mask 1400 with bridge structure 1402. With reference to FIG. 14, the identical mask can include a first mask pattern 1406 and a second mask pattern 1408, and bridge structure 1402 is provided between first mask pattern 1406 and second mask pattern 1408.

It should be noted that when the first hard mask and the second hard mask are an identical mask, the identical mask can include not only first mask pattern 1406 and second mask pattern 1408, and the mask patterns included in the identical mask can be set in accordance with application requirements and design requirements. For example, the identical mask can further include a third mask pattern (not shown in FIG. 14) and a fourth mask pattern (not shown in FIG. 14). A bridge structure (not shown in FIG. 14) can also be provided between the third mask pattern and the fourth mask pattern. As another example, the identical mask can further include the third mask pattern and the fourth mask pattern, and no bridge structure is provided between the third mask pattern and the fourth mask pattern.

In some embodiments, with reference to FIG. 14 and step 901 of FIG. 9, based on hard mask 1400 with bridge structure 1402, a preset material can be formed on a preset bare silicon wafer 1410 through a first hard mask to generate a first structure by generating, based on a first projection angle, the preset material on the bare silicon wafer to generate the first structure through the first mask pattern and the second mask pattern on the identical mask.

Figure 15:
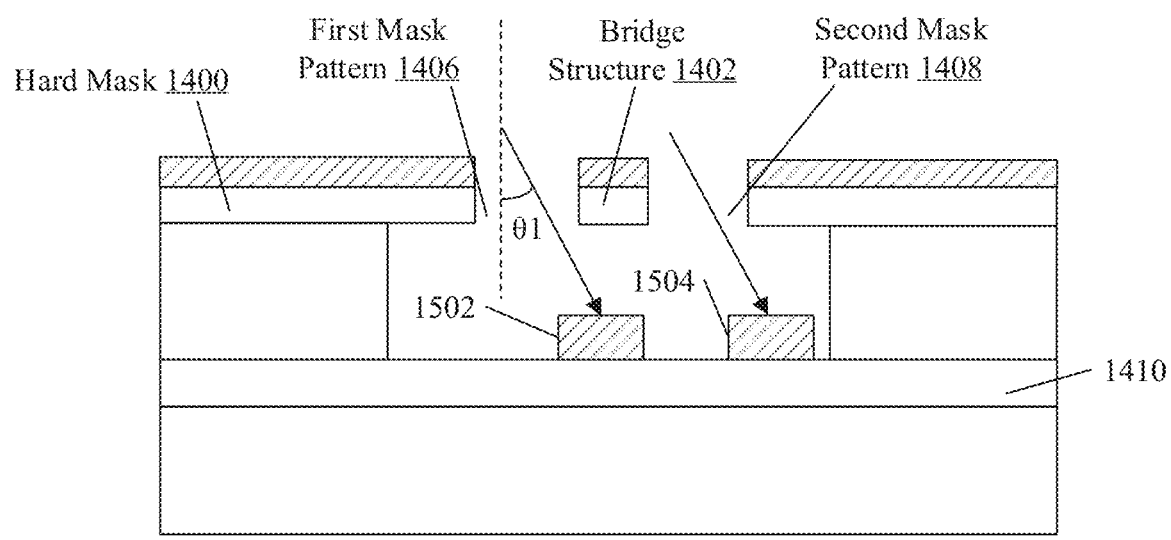
FIG. 15 is a schematic diagram illustrating an example generation of a preset material on a bare silicon wafer based on a first projection angle, consistent with some embodiments of this disclosure.

By way of example, FIG. 15 is a schematic diagram illustrating generation of a preset material on a bare silicon wafer based on a first projection angle, consistent with some embodiments of this disclosure. With reference to FIGS. 9 and 15, a first hard mask (e.g., the first hard mask at step 901 of FIG. 9) and a second hard mask (e.g., the second hard mask at step 902 of FIG. 9) can be an identical mask, and the identical mask can include first mask pattern 1406 and second mask pattern 1408. As shown in FIG. 15, the first projection angle is θ1, and a preset material (represented as shaded boxes in FIG. 15) can be formed with hard mask 1400 through the first projection angle θ1. The preset material can be formed on bare silicon wafer 1410 through first mask pattern 1406 and second mask pattern 1408 on the identical mask, so that a first structure (e.g., the first structure at step 901 of FIG. 9) can be generated. For example, the first structure can include a first sub-structure 1502 and a second sub-structure 1504 corresponding to first mask pattern 1406 and second mask pattern 1408, respectively.

In some embodiments, with reference to FIG. 15 and step 902 of FIG. 9, based on hard mask 1400 with bridge structure 1402, the preset material can be formed on the preset bare silicon wafer through a second hard mask to generate a second structure by generating, based on a second projection angle, the preset material on the bare silicon wafer to generate the second structure through the first mask pattern and the second mask pattern on the identical mask. The first projection angle can be different from the second projection angle, and an overlapping structure can exist between the first structure and the second structure.

Figure 16:
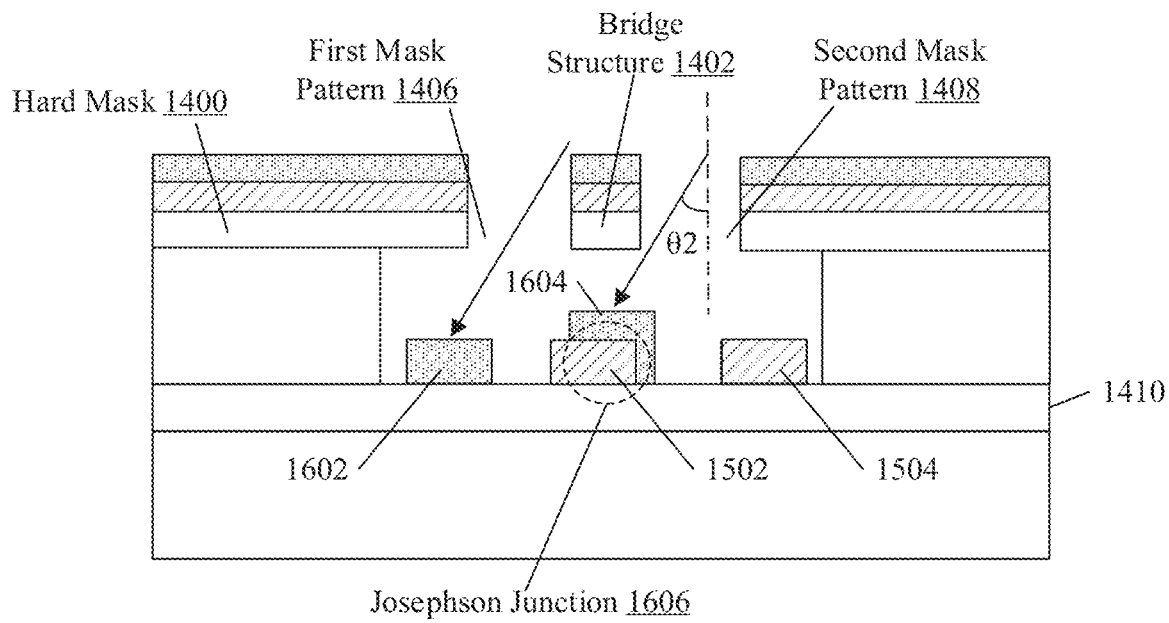
FIG. 16 is a schematic diagram illustrating an example generation of a preset material on a bare silicon wafer based on a second projection angle, consistent with some embodiments of this disclosure.

By way of example, FIG. 16 is a schematic diagram illustrating generation of a preset material on a bare silicon wafer based on a second projection angle, consistent with some embodiments of this disclosure. FIG. 16 can include similar elements to FIG. 15. As shown in FIG. 16, the second projection angle is θ2. The second projection angle θ2 is different from the first projection angle θ1 shown in FIG. 15. In FIG. 16, the preset material (represented as dotted boxes in FIG. 16) can be formed with hard mask 1400 through the second projection angle θ2. For example, the preset material can be formed on bare silicon wafer 1410 through first mask pattern 1406 and second mask pattern 1408 on the identical mask, so that a second structure (e.g., the second structure at step 902 of FIG. 9) can be generated. For example, the second structure can include a third sub-structure 1602 and a fourth sub-structure 1604 corresponding to first mask pattern 1406 and second mask pattern 1408, respectively. Because the second projection angle θ2 is different from the first projection angle θ1, the positions of the first structure and the second structure on bare silicon wafer 1410 can be different.

To form a Josephson junction, an overlapping structure can form between the first structure and the second structure, in which the overlapping structure can be the Josephson junction. For example, as shown in FIG. 16, an overlapping structure can be formed between first sub-structure 1502 and fourth sub-structure 1604, which can form a Josephson junction 1606 (represented as a dash-circle in FIG. 16).

Consistent with some embodiments of this disclosure, with reference to FIG. 9, when the first hard mask (e.g., the first hard mask at step 901 of FIG. 9) and the second hard mask (e.g., the second hard mask at step 902 of FIG. 9) for preparing a Josephson junction are an identical mask, the identical mask can include two mask patterns with no bridge structure provided between the two mask patterns.

Figure 17:
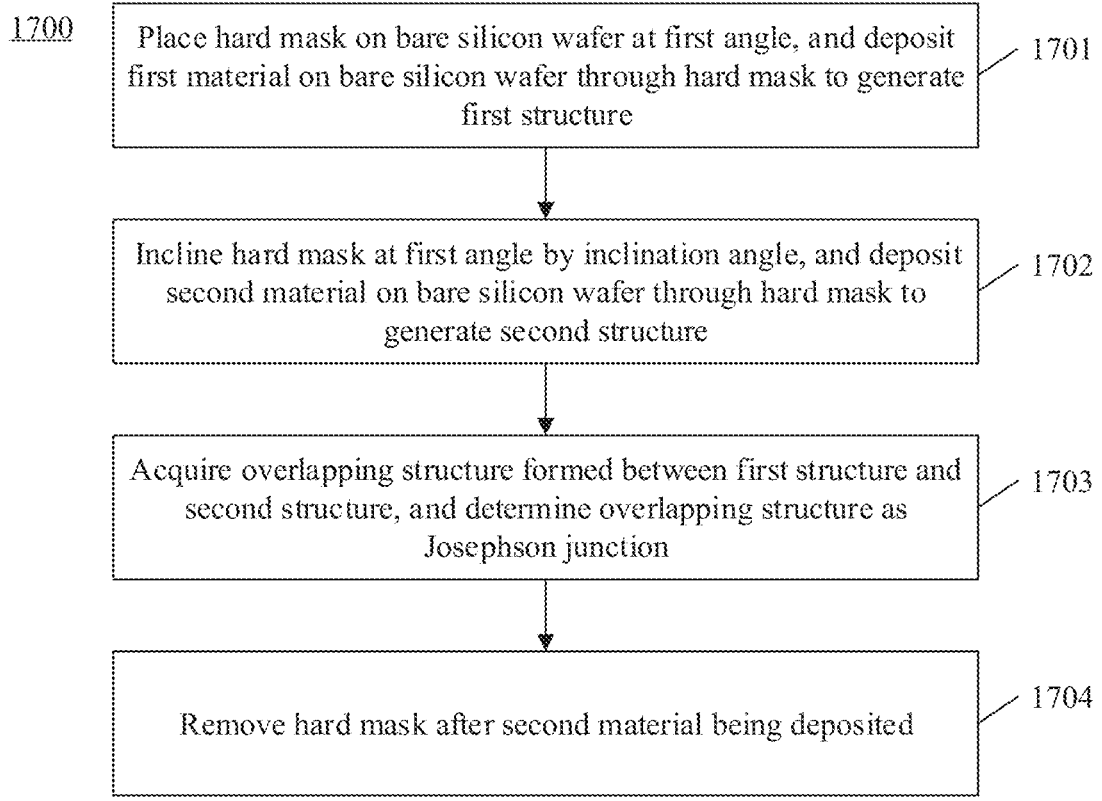
FIG. 17 is a flowchart illustrating another example method for preparing a Josephson junction, consistent with some embodiments of this disclosure.

By way of example, FIG. 17 is a flowchart illustrating another example method 1700 for preparing a Josephson junction, consistent with some embodiments of this disclosure. At step 1701, a hard mask can be placed on a bare silicon wafer at a first angle, and a first material (e.g., an aluminum material) can be deposited on the bare silicon wafer through the hard mask to generate a first structure. At step 1702, the hard mask at the first angle can be inclined by an inclination angle (e.g., 90°), and then a second material (e.g., an aluminum material) can be deposited on the bare silicon wafer through the hard mask to generate a second structure. At step 1703, an overlapping structure formed between the first structure and the second structure can be acquired, and the overlapping structure can be determined as a Josephson junction. At step 1704, after the second material is deposited, the hard mask can be removed (e.g., by high-frequency vapor corrosion).

For example, at step 1704, HF vapor can be used to remove the hard mask, which has SiOx corrosion selectivity on aluminum and alumina. In some embodiments, to quickly remove the hard mask, a preset pattern can be added to the hard mask. When the preset pattern is a circular pattern, a size of the circular pattern can be about 100 nm (e.g., 100±5 nm). When the preset pattern is an inclined line pattern, the inclined line pattern cannot be parallel to an edge of the Josephson junction to ensure the formation of corresponding traces on the Josephson junction.

As described in association with FIGS. 9-17, technical solutions of preparing a Josephson junction based on a hard mask is provided in combination with semiconductor technology. Compared with a conventional soft mask technology in which only a single superconducting material can be prepared using a single process, the provided technical solutions have no limitation to the preparation process of the Josephson junction or to the selection of materials. In addition, the provided technical solutions can be used for preparing superconducting materials by an ultra-high vacuum device, so that the coherence life of qubits can be prolonged, and the practicability and application range of the provided technical solutions can be further improved.

Consistent with some embodiments of this disclosure, a superconducting circuit is also provided. Superconducting qubits can be generated when the superconducting circuit is located in a preset environment. In some embodiments, the superconducting circuit can include a Josephson junction serving as a nonlinear inductance element. The Josephson junction can be generated by one or more of the technical solutions described in association with FIGS. 1-17.

Figure 18:
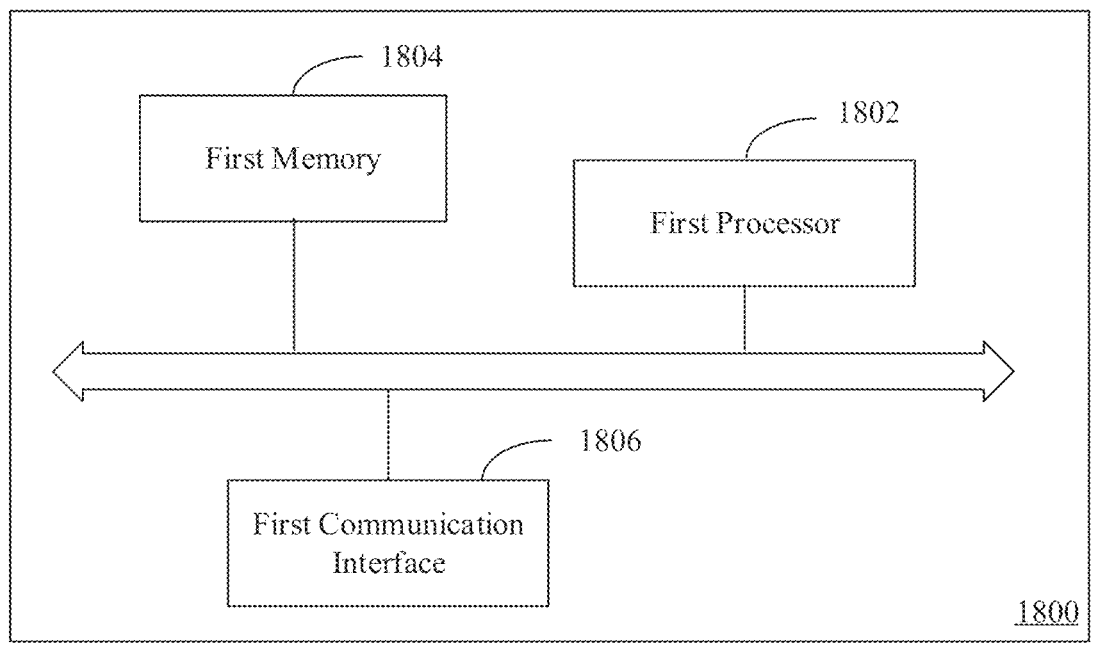
FIG. 18 is a schematic diagram of an example device for preparing a hard mask, consistent with some embodiments of this disclosure.

By way of example, FIG. 18 is a schematic diagram of an example device 1800 for preparing a hard mask, consistent with some embodiments of this disclosure. As illustrated in FIG. 18, device 1800 can include a first processor 1802 and a first memory 1804 (e.g., a non-transitory computer-readable medium). First memory 1804 can store a program for device 1800 to perform a method of preparing a hard mask, such as one or more of the methods described in association with FIGS. 4-8. As illustrated in FIG. 18, device 1800 can further include first communication interface 1806 for device 1800 to communicate with other devices or a communication network.

First processor 1802 can execute the program stored in first memory 1804. The program can include one or more computer instructions. For example, when the one or more computer instructions are executed by first processor 1802, the method of preparing a hard mask (e.g., one or more of the methods described in association with FIGS. 4-8) can be implemented. As another example, first processor 1802 can execute all or part of the steps in one or more of the methods described in association with FIGS. 4-8.

In some embodiments, a non-transitory computer-readable medium for storing computer software instructions can be provided with device 1800. The non-transitory computer-readable medium can include a program for performing the method of preparing a hard mask (e.g., one or more of the methods described in association with FIGS. 4-8).

Figure 19:
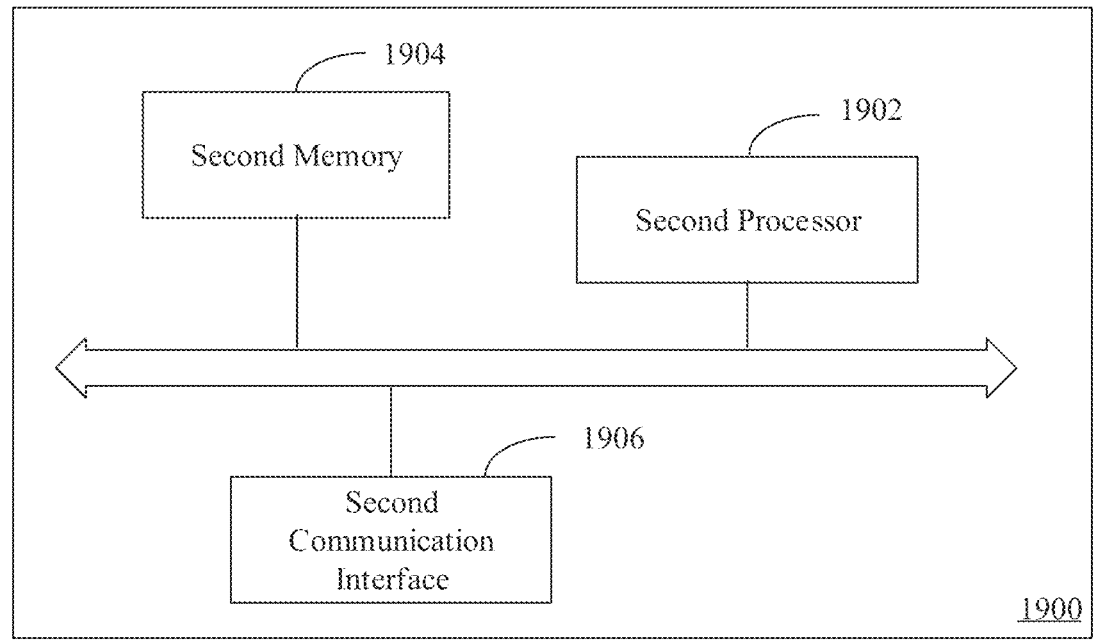
FIG. 19 is a schematic diagram of an example device for preparing a Josephson junction, consistent with some embodiments of this disclosure.

By way of example, FIG. 19 is a schematic diagram of an example device 1900 for preparing a Josephson junction, consistent with some embodiments of this disclosure. As illustrated in FIG. 19, device 1900 can include a second processor 1902 and a second memory 1904 (e.g., a non-transitory computer-readable medium). Second memory 1904 can store a program for device 1900 to perform a method of preparing a Josephson junction, such as one or more of the methods described in association with FIGS. 9-17. As illustrated in FIG. 19, device 1900 can further include second communication interface 1906 for device 1900 to communicate with other devices or a communication network.

Second processor 1902 can execute the program stored in second memory 1904. The program can include one or more computer instructions. For example, when the one or more computer instructions are executed by second processor 1902, the method of preparing a Josephson junction (e.g., one or more of the methods described in association with FIGS. 9-17) can be implemented. As another example, second processor 1902 can execute all or part of the steps in one or more of the methods described in association with FIGS. 9-17.

In some embodiments, a non-transitory computer-readable medium for storing computer software instructions can be provided with device 1900. The non-transitory computer-readable medium can include a program for performing the method of preparing a Josephson junction (e.g., one or more of the methods described in association with FIGS. 9-17).

The embodiments can further be described using the following clauses:

1. A hard mask, comprising:
a silicon oxide layer provided on a bare silicon wafer; and
a silicon nitride layer provided on the silicon oxide layer, wherein:
the silicon nitride is provided with a first pattern,
the silicon oxide layer is provided with a second pattern corresponding to the first pattern,
the first pattern and the second pattern have different shapes, and
the first pattern and the second pattern are configured to assist in forming a Josephson junction on the bare silicon wafer.

2. The hard mask of clause 1, further comprising:
an image transmission layer provided on the silicon nitride layer, the image transmission layer being provided with a third pattern configured to assist in forming the first pattern corresponding to the third pattern on the silicon nitride.

3. The hard mask of clause 2, wherein the image transmission layer is formed by a chromium material.

4. The hard mask of clause 2, wherein thickness of the image transmission layer is greater than or equal to 15 nanometers and smaller than or equal to 50 nanometers.

5. The hard mask of clause 2, wherein a line width size of the third pattern is the same as a line width size of the first pattern.

6. The hard mask of clause 2, wherein a line width size of the first pattern, a line width size of the second pattern, and a line width size of the third pattern are greater than or equal to 100 nanometers.

7. The hard mask of any of clauses 1-6, wherein a stress of the silicon nitride layer is smaller than or equal to a preset threshold.

8. The hard mask of any of clauses 1-6, wherein a line width size of the second pattern is greater than or equal to a line width size of the first pattern.

9. The hard mask of any of clauses 1-6, wherein thickness of the silicon oxide layer is greater than or equal to 200 nm and smaller than or equal to 800 nanometers.

10. The hard mask of any of clauses 1-6, wherein thickness of the silicon nitride layer is greater than or equal to 400 nanometers and smaller than or equal to 1,400 nanometers.

11. A method for preparing a hard mask, the method comprising:
forming a silicon oxide layer on a preset bare silicon wafer;
forming a silicon nitride layer on the silicon oxide layer; and
forming a first pattern on the silicon nitride layer and a second pattern corresponding to the first pattern on the silicon oxide layer to form a hard mask, wherein
the first pattern and the second pattern have different shapes, and
the first pattern and the second pattern are configured to assist in forming a Josephson junction on the bare silicon wafer.

12. The method of clause 11, further comprising:
acquiring a stress of the silicon nitride layer; and
when the stress is greater than a preset stress threshold, adjusting a ratio between a nitrogen material and a silicon material in the silicon nitride layer to cause the stress to be smaller than or equal to the preset stress threshold.

13. The method of clause 11, wherein forming the first pattern on the silicon nitride layer comprises:
forming an image transmission layer on the silicon nitride layer;
forming a third pattern on the image transmission layer; and
forming the first pattern on the silicon nitride layer based on the third pattern.

14. The method of clause 13, wherein forming the third pattern on the image transmission layer comprises:
forming a photoresist layer on the image transmission layer;
forming a pattern to be transmitted on the photoresist layer; and
forming the third pattern on the image transmission layer based on the pattern to be transmitted.

15. The method of clause 13, wherein forming the image transmission layer comprises forming the image transmission layer by a chromium material.

16. The method of clause 13, wherein thickness of the image transmission layer is greater than or equal to 15 nanometers and smaller than or equal to 50 nanometers.

17. The method of clause 13, wherein a line width size of the third pattern is the same as a line width size of the first pattern.

18. The method of clause 13, wherein a line width size of the first pattern, a line width size of the second pattern, and a line width size of the third pattern are greater than or equal to 100 nanometers.

19. The method of clause 11, wherein forming the first pattern on the silicon nitride layer comprises:
anisotropically etching the silicon nitride layer to form the first pattern on the silicon nitride layer.

20. The method of clause 19, wherein anisotropically etching the silicon nitride layer to form the first pattern on the silicon nitride layer comprises:
anisotropically etching the silicon nitride layer using an inductively coupled etching device to form the first pattern on the silicon nitride layer.

21. The method of clause 19, wherein anisotropically etching the silicon nitride layer to form the first pattern on the silicon nitride layer comprises:
anisotropically etching the silicon nitride layer based on reactive ion etching to form the first pattern on the silicon nitride layer.

22. The method of clause 11, wherein forming the second pattern corresponding to the first pattern on the silicon oxide layer comprises:
forming, based on the first pattern, an intermediate pattern corresponding to the first pattern on the silicon oxide layer, wherein a distance between the intermediate pattern and the bare silicon wafer is greater than zero; and
cleaning the intermediate pattern using a preset cleaning solution to form the second pattern corresponding to the first pattern, wherein the second pattern and the intermediate pattern have different shapes.

23. The method of clause 22, wherein the cleaning solution comprises at least one of a hydrofluoric acid solution or a buffered hydrofluoric acid solution.

24. The method of clause 22, wherein the second pattern comprises an undercut structure generated by a cleaning operation of the cleaning solution.

25. The method of any of clauses 11-24, wherein a stress of the silicon nitride layer is smaller than or equal to a preset threshold.

26. The method of any of clauses 11-24, wherein a line width size of the second pattern is greater than or equal to a line width size of the first pattern.

27. The method of any of clauses 11-24, wherein thickness of the silicon oxide layer is greater than or equal to 200 nanometers and smaller than or equal to 800 nanometers.

28. The method of any of clauses 11-24, wherein thickness of the silicon nitride layer is greater than or equal to 400 nanometers and smaller than or equal to 1,400 nanometers.

29. A device for preparing a hard mask, comprising:
a memory configured to store a set of instructions; and
one or more processors communicatively coupled to the memory and configured to execute the set of instructions to cause the apparatus to perform a method, the method comprising:
forming a silicon oxide layer on a preset bare silicon wafer;
forming a silicon nitride layer on the silicon oxide layer; and
forming a first pattern on the silicon nitride layer and a second pattern corresponding to the first pattern on the silicon oxide layer to form a hard mask, wherein
the first pattern and the second pattern have different shapes, and
the first pattern and the second pattern are configured to assist in forming a Josephson junction on the bare silicon wafer.

30. A non-transitory computer-readable medium storing a set of instructions that is executable by at least one processor of an apparatus to cause the apparatus to perform a method for preparing a Josephson junction, the method comprising:
forming a silicon oxide layer on a preset bare silicon wafer;
forming a silicon nitride layer on the silicon oxide layer; and
forming a first pattern on the silicon nitride layer and a second pattern corresponding to the first pattern on the silicon oxide layer to form a hard mask, wherein
the first pattern and the second pattern have different shapes, and
the first pattern and the second pattern are configured to assist in forming a Josephson junction on the bare silicon wafer.

31. A method for preparing a Josephson junction, the method comprising:
forming a preset material on a preset bare silicon wafer through a first hard mask to generate a first structure;
forming the preset material on the preset bare silicon wafer through a second hard mask to generate a second structure, the first structure and the second structure being in different directions; and
generating the Josephson junction through the first structure and the second structure, the Josephson junction serving as a nonlinear inductance element.

32. The method of clause 31, wherein the preset material comprises any of an aluminum material, a binary nitride material, a ternary nitride material, or a composite oxide material.

33. The method of clause 31, wherein generating the Josephson junction through the first structure and the second structure comprises:
acquiring an overlapping structure formed between the first structure and the second structure; and
determining the overlapping structure as the Josephson junction.

34. The method of clause 31, wherein a direction of the first structure is perpendicular to a direction of the second structure.

35. The method of clause 31, further comprising removing the first hard mask and the second hard mask.

36. The method of clause 35, wherein removing the first hard mask and the second hard mask comprises:
when the second hard mask is located on the first hard mask, forming a plurality of preset patterns on the second hard mask; and
removing the first hard mask and the second hard mask based on the plurality of preset patterns.

37. The method of clause 36, wherein the plurality of preset patterns comprises a plurality of circular hole patterns or a plurality of inclined line patterns.

38. The method of clause 37, wherein line width sizes of the plurality of circular hole patterns are smaller than or equal to 100 nanometers.

39. The method of clause 37, wherein the plurality of inclined line patterns is inclined at an angle of 45° with respect to an edge of the second hard mask, and line widths of the plurality of inclined line patterns are smaller than or equal to 100 nanometers.

40. The method of clause 31, wherein the first hard mask and the second hard mask are the same mask.

41. The method of clause 31, wherein the first hard mask and the second hard mask are an identical mask.

42. The method of clause 41, wherein the identical mask comprises a first mask pattern, a second mask pattern, and a bridge structure provided between the first mask pattern and the second mask pattern.

43. The method of clause 42, wherein forming the preset material on the preset bare silicon wafer through the first hard mask to generate the first structure comprises:
generating, based on a first projection angle, the preset material on the bare silicon wafer to generate the first structure through the first mask pattern and the second mask pattern on the identical mask; and
wherein forming the preset material on the preset bare silicon wafer through the second hard mask to generate the second structure comprises:
generating, based on a second projection angle, the preset material on the bare silicon wafer to generate the second structure through the first mask pattern and the second mask pattern on the identical mask, wherein the first projection angle is different from the second projection angle, and an overlapping structure exists between the first structure and the second structure.

44. A superconducting circuit, comprising:
a Josephson junction serving as a nonlinear inductance element, the Josephson junction being prepared by a method, the method comprising:
forming a preset material on a preset bare silicon wafer through a first hard mask to generate a first structure;
forming the preset material on the preset bare silicon wafer through a second hard mask to generate a second structure, the first structure and the second structure being in different directions; and
generating the Josephson junction through the first structure and the second structure.

45. A device for preparing a Josephson junction, comprising:
a memory configured to store a set of instructions; and
one or more processors communicatively coupled to the memory and configured to execute the set of instructions to cause the apparatus to perform:
forming a preset material on a preset bare silicon wafer through a first hard mask to generate a first structure;
forming the preset material on the preset bare silicon wafer through a second hard mask to generate a second structure, the first structure and the second structure being in different directions; and generating the Josephson junction through the first structure and the second structure, the Josephson junction serving as a nonlinear inductance element.

46. A non-transitory computer-readable medium storing a set of instructions that is executable by at least one processor of an apparatus to cause the apparatus to perform a method for preparing a Josephson junction, the method comprising forming a preset material on a preset bare silicon wafer through a first hard mask to generate a first structure;

forming the preset material on the preset bare silicon wafer through a second hard mask to generate a second structure, the first structure and the second structure being in different directions; and generating the Josephson junction through the first structure and the second structure, the Josephson junction serving as a nonlinear inductance element.

47. A hard mask being prepared by a method, the method comprising:

forming a silicon oxide layer on a preset bare silicon wafer;

forming a silicon nitride layer on the silicon oxide layer; and forming a first pattern on the silicon nitride layer and a second pattern corresponding to the first pattern on the silicon oxide layer to form a hard mask, wherein the first pattern and the second pattern have different shapes, and the first pattern and the second pattern are configured to assist in forming a Josephson junction on the bare silicon wafer.

The apparatus embodiment described herein is only schematic, where the units described as separate components can or cannot be physically separated, and the units displayed as modules can or cannot be physical units. That is, the units herein can be located in one place, or can be distributed to a plurality of network units. Part or all of the modules can be selected in accordance with actual needs to achieve the purpose of the solution of the present embodiment. Those of ordinary skill in the art can understand and implement without creative efforts.

From the description of the above implementations, those skilled in the art can clearly understand that the various implementations can be implemented by means of a necessary general hardware platform, and can also be implemented by means of a combination of hardware and software. Based on such understanding, the above technical solution or the part that contributes to the prior art can be embodied in the form of a computer product, and the present disclosure can be in the form of a computer program product implemented on one or more computer-usable storage media (including but not limited to, a magnetic disk memory, a CD-ROM, an optical memory, and the like) including computer-usable program code.

The present disclosure is described with reference to flowcharts and/or block diagrams of methods, devices (systems), and computer program products in accordance with embodiments of the present disclosure. It should be understood that each flow and/or block in the flowcharts and/or block diagrams and a combination of flows and/or blocks in the flowcharts and/or block diagrams can be implemented by computer program instructions. These computer program instructions can be provided to a processor of a general-purpose computer, a special-purpose computer, an embedded processor, or another programmable device to produce a machine, so that the instructions executed by the processor of the computer or another programmable device produce an apparatus for realizing the functions specified in one or more flows of the flowcharts and/or one or more blocks of the block diagrams.

These computer program instructions can also be stored in a computer-readable memory that can direct a computer or another programmable device to work in a specific manner, so that the instructions stored in this computer-readable memory produce an article of manufacture including an instruction apparatus which implements the functions specified in one or more flows of the flowcharts and/or one or more blocks of the block diagrams.

These computer program instructions can also be loaded onto a computer or another programmable device, so that a series of operation steps are performed on the computer or another programmable device to produce computer-implemented processing, so that the instructions executed on the computer or another programmable device provide steps for implementing the functions specified in one or more flows of the flowcharts and/or one or more blocks of the block diagrams.

In a typical configuration, the computing device includes one or more central processing units (CPUs), an input/output interface, a network interface, and a memory. The memory can include a volatile memory, a Random Access Memory (RAM), and/or non-volatile memory in computer-readable media, e.g., a Read-Only Memory (ROM) or a flash RAM. The memory is an example of the computer-readable medium. The non-transitory computer-readable medium includes permanent and non-permanent, removable and non-removable media, and can store information by any method or technology. The information can be computer-readable instructions, data patterns, program modules, or other data. Examples of computer storage media include, but are not limited to, a phase change memory (PRAM), a static random access memory (SRAM), a dynamic random access memory (DRAM), other types of random access memories (RAM), a read-only memory (ROM), an electrically erasable programmable read-only memory (EEPROM), a flash memory or other memory technologies, a read-only compact disc read-only memory (CD-ROM), a digital versatile disk (DVD) or other optical storage, a magnetic tape cassette, a magnetic tape magnetic disk storage or other magnetic storage devices, or any other non-transmission medium, and the computer storage media can be used to store information that can be accessed by computing devices. As defined herein, the non-transitory computer-readable medium does not include temporary computer-readable media (transitory media), such as a modulated data signal and a carrier.

It should be noted that the above examples are only intended to describe the technical solution of the present disclosure, not to limit it. Although the present disclosure has been described in detail with reference to the foregoing embodiments, those of ordinary skill in the art will appreciate that the technical solution in the foregoing embodiments can still be modified, or some of the technical features thereof can be equivalently substituted. Such modifications and substitutions do not make the essence of the corresponding technical solution depart from the spirit and scope of the technical solutions of the various embodiments of the present disclosure.

The invention claimed is:
1. A hard mask, comprising:
a silicon oxide layer provided on a bare silicon wafer; and
a silicon nitride layer provided on the silicon oxide layer, wherein:

the silicon nitride is provided with a first pattern, the silicon oxide layer is provided with a second pattern corresponding to the first pattern, the first pattern and the second pattern have different shapes, the first pattern and the second pattern are in different directions and form an overlapping structure, and the first pattern and the second pattern are configured to assist in forming a Josephson junction on the bare silicon wafer.

2. The hard mask of claim 1, further comprising:

an image transmission layer provided on the silicon nitride layer, the image transmission layer being provided with a third pattern configured to assist in forming the first pattern corresponding to the third pattern on the silicon nitride.

3. The hard mask of claim 2, wherein the image transmission layer is formed by a chromium material.

4. The hard mask of claim 2, wherein thickness of the image transmission layer is greater than or equal to 15 nanometers and smaller than or equal to 50 nanometers.

5. The hard mask of claim 2, wherein a line width size of the third pattern is the same as a line width size of the first pattern.

6. The hard mask of claim 2, wherein a line width size of the first pattern, a line width size of the second pattern, and a line width size of the third pattern are greater than or equal to 100 nanometers.

7. The hard mask of claim 1, wherein a line width size of the second pattern is greater than or equal to a line width size of the first pattern.

8. The hard mask of claim 1, wherein thickness of the silicon oxide layer is greater than or equal to 200 nm and smaller than or equal to 800 nanometers.

9. The hard mask of claim 1, wherein thickness of the silicon nitride layer is greater than or equal to 400 nanometers and smaller than or equal to 1,400 nanometers.

* * * * *